(12) United States Patent  
Toriyama et al.

(10) Patent No.: US 7,643,346 B2  
(45) Date of Patent: Jan. 5, 2010

(54) NAND TYPE NONVOLATILE SEMICONDUCTOR MEMORY DEVICE HAVING SIDEFACE ELECTRODE SHARED BY MEMORY CELLS

(75) Inventors: Shuichi Toriyama, Kanagawa (JP); Kazuya Matsuzawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 12/052,149

(22) Filed: Mar. 20, 2008

(65) Prior Publication Data

US 2009/0059669 A1 Mar. 5, 2009

(30) Foreign Application Priority Data

Aug. 31, 2007 (JP) .............................. 2007-226400

(51) Int. Cl.  
*G11C 11/34* (2006.01)

(52) U.S. Cl. ............... 365/185.17; 365/63; 365/185.23; 365/185.27

(58) Field of Classification Search ................ 365/63, 365/185.17, 185.23, 185.27  
See application file for complete search history.

(56) References Cited

U.S. PATENT DOCUMENTS 5,969,990 A * 10/1999 Arase .................... 365/185.25

| 6,093,605 A * | 7/2000 | Mang et al. ................. 438/257 |
| 6,115,287 A * | 9/2000 | Shimizu et al. ......... 365/185.17 |
| 6,191,975 B1 * | 2/2001 | Shimizu et al. ......... 365/185.17 |
| 7,355,237 B2 * | 4/2008 | Lutze et al. ................ 257/314 |
| 7,512,005 B2 * | 3/2009 | Mokhlesi ............... 365/185.17 |

FOREIGN PATENT DOCUMENTS

JP 2006-66750 3/2006

* cited by examiner

*Primary Examiner*—Tuan T Nguyen  
*Assistant Examiner*—Alexander Sofocleous  
(74) *Attorney, Agent, or Firm*—Oblon, Spivak, McClelland, Maier & Neustadt, L.L.P.

(57) ABSTRACT

An electrically erasable programmable read-only memory (EEPROM) device of the NAND type having sideface electrodes as auxiliary electrodes on the opposite lateral surfaces of a transistor channel region to thereby improve operation margins is discusssed. The NAND EEPROM, also known as NAND flash memory, has on a semiconductive substrate an array of memory cells including a serial combination of memory cell transistors. Each of memory cell transistors has a pair of source and drain regions, a channel region, a tunnel insulator film, a charge storage layer, a control dielectric film, a control electrode, a sideface dielectric film on the sidefaces of the channel region, and sideface electrodes which are formed on the side surfaces of channel region with the channel region being laterally interposed therebetween. The sideface electrodes are commonized or "shared" by adjacent ones of the serially coupled memory cell transistors.

10 Claims, 26 Drawing Sheets

Erase Operation

Two-value (1bit/cell)

Multi-value (2bit/ell)

Read Operation

Write Operation

Erase Operation

NAND TYPE NONVOLATILE SEMICONDUCTOR MEMORY DEVICE HAVING SIDEFACE ELECTRODE SHARED BY MEMORY CELLS

CROSS-REFERENCE TO RELATED APPLICATION

This application is based upon and claims the benefit of priority from Japanese Patent Application No. 2007-226400, filed Aug. 31, 2007, the entire contents of which are incorporated herein by reference.

FIELD OF THE INVENTION

The present invention relates to electrically rewritable nonvolatile semiconductor memory devices of the NAND type.

DESCRIPTION OF RELATED ART

Currently available nonvolatile semiconductor memory devices include electrically erasable and programmable read-only memories (EEPROMs), examples of which are "flash" memories of the AND type, NOR type, and NAND type. Of these types of flash memories, NAND flash memory offers increased integration densities as it has an array of serial combinations of memory cell transistors having source and drain diffusion layers, each of which is commonly used or "shared" by adjacent ones of the memory cell transistors. Accordingly, NAND flash memory is becoming more important in the manufacture of extra-large capacity of file memories, such as universal serial bus (USB) memory. Another known architecture is what is called the multi-level (or multi-value) cell technique, which accurately controls and limits more finely the amount of electrical charge to be stored in a memory cell to thereby enable more than two bits of logical value data to be stored in a single cell.

Readily understandably, with advances in device miniaturization and low voltage design, memory cells of a nonvolatile semiconductor memory device become less in operation margins for reading, writing or "programming," and erasing. One proposed approach to improving the operation margins of nonvolatile semiconductor memory device is to provide an auxiliary electrode to AND flash memory, as taught from JP-A 2006-66750 (KOKAI).

BRIEF SUMMARY OF THE INVENTION

In accordance with one aspect of this invention, a nonvolatile semiconductor memory device is arranged to have a semiconductor substrate and a plurality of memory cells on the semiconductor substrate, each of the memory cells has a memory cell transistor. The memory cells form an array of memory cells including a serial connection of a plurality of memory cell transistors. Each of the memory cell transistors has a pair of source and drain regions formed in the semiconductor substrate, a channel region having upper surface and side surfaces laterally interposed between the source and drain regions, a tunnel insulator film provided on the upper surface of the channel region, a charge storage layer on the tunnel insulator film, a control dielectric film on the charge storage layer, a control electrode on the control dielectric film, a side-face dielectric film provided on the side surfaces of the channel region, and first and second separate sideface electrodes provided on the sideface dielectric film to oppose each other with the channel region being laid therebetween. The first sideface electrode is each shared by neighboring ones of the memory cell transistors which are serially connected together. The second sideface electrode is each shared by neighboring ones of the memory cell transistors which are serially connected together.

DETAILED DESCRIPTION OF THE EMBODIMENTS

In the description below, the term "channel region" refers to a semiconductive region which forms the channel of a memory cell transistor in at least partial area of it for allowing electrical charge to flow therein. The term "NAND string" as used in the description refers to a group of a prespecified number of series-connected memory cell transistors, which group is for use as one constituent component of a memory cell array. A nonvolatile semiconductor memory device embodying the invention has a semiconductor substrate and a memory cell array which is provided on the semiconductor substrate. This memory cell array includes a serial combination of a plurality of memory cell transistors. A respective one of these memory cell transistors has a pair of source and drain regions formed in a surface portion of the semiconductor substrate, a channel region laterally interposed between the source and drain regions, a tunnel insulator film provided on the upper surface of the channel region, a charge storage layer on the tunnel insulator film, a control dielectric film on the charge storage layer, a control electrode on the control dielectric film, a sideface dielectric film provided on side surfaces of the channel region, and two separate sideface electrodes provided on the sideface dielectric film to oppose each other with the channel region being laid therebetween. At least the sideface electrodes of these constituent components are each commonized or "shared" by neighboring ones of the serially connected memory cell transistors.

According to this embodiment device, the application of a negative voltage to the sideface electrode during a read operation makes it possible to achieve the improvement of the cut-off characteristics of memory cell transistors. Thus it is possible to enlarge a difference between a channel current flowing in the case of data of a logical "1" and a channel current flowing in the case of logic "0" data, thereby enabling appreciable enhancement of the margin of data read operations. In addition, by applying a positive voltage to the sideface electrode during a write operation, it becomes possible to lower both electrical-resistance of the channel and that of the diffusion layers. This in turn makes it possible to improve the margin of data write operations. Furthermore, applying an erase voltage to the sideface electrode during an erase operation makes it possible to effectively draw out electrons for injection into the sideface electrode. Alternatively, owing to the application of the erase voltage to the sideface electrode during an erase operation, the erase voltage at the channel region becomes stable in potential. Thus, it becomes possible to reliably perform the intended erase operation.

Figure 1:
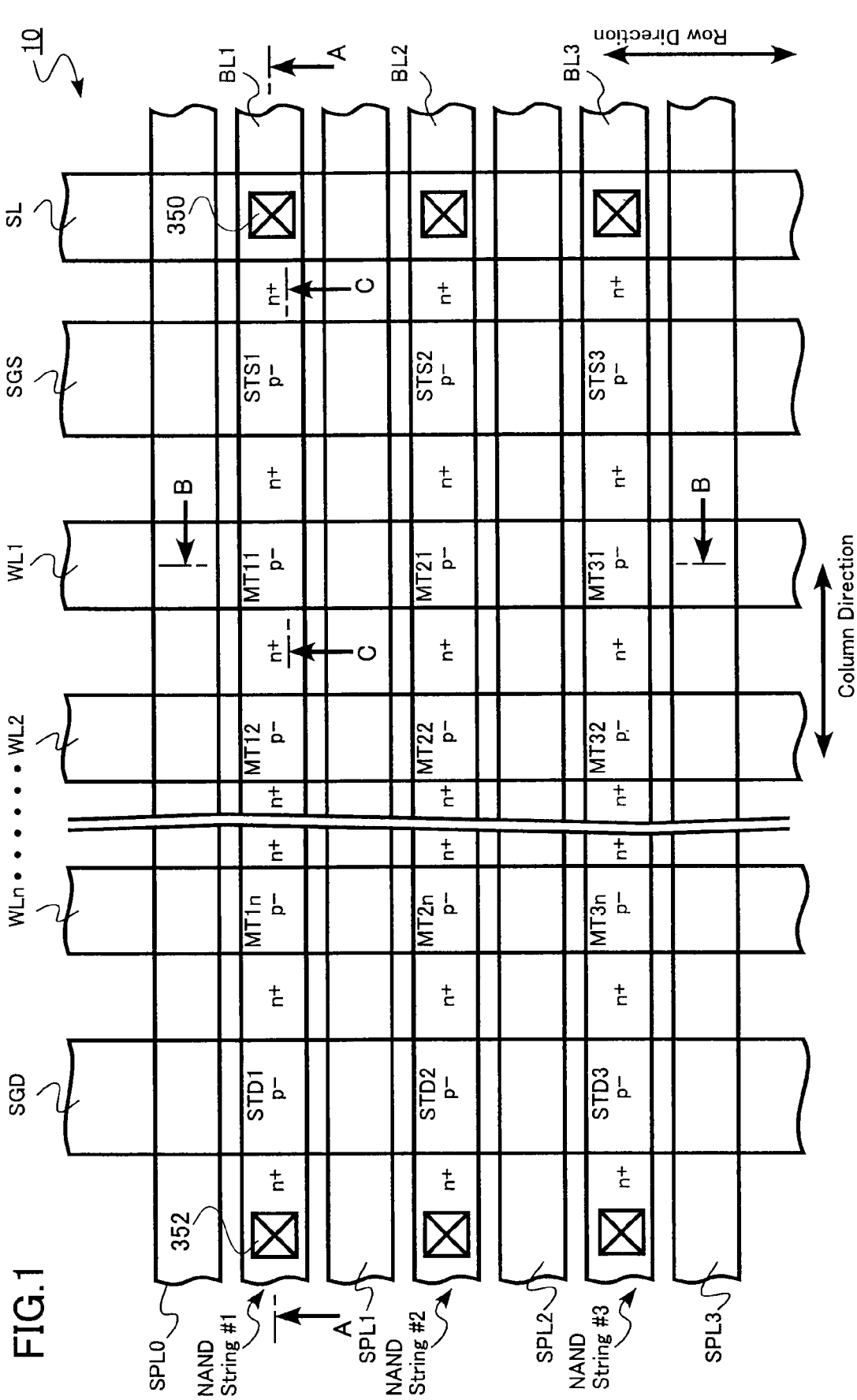
FIG. 1 is a top plan view of main part of an electrically erasable programmable read-only memory (EEPROM) device of the NAND type in accordance with one embodiment of this invention.
Figure 2:
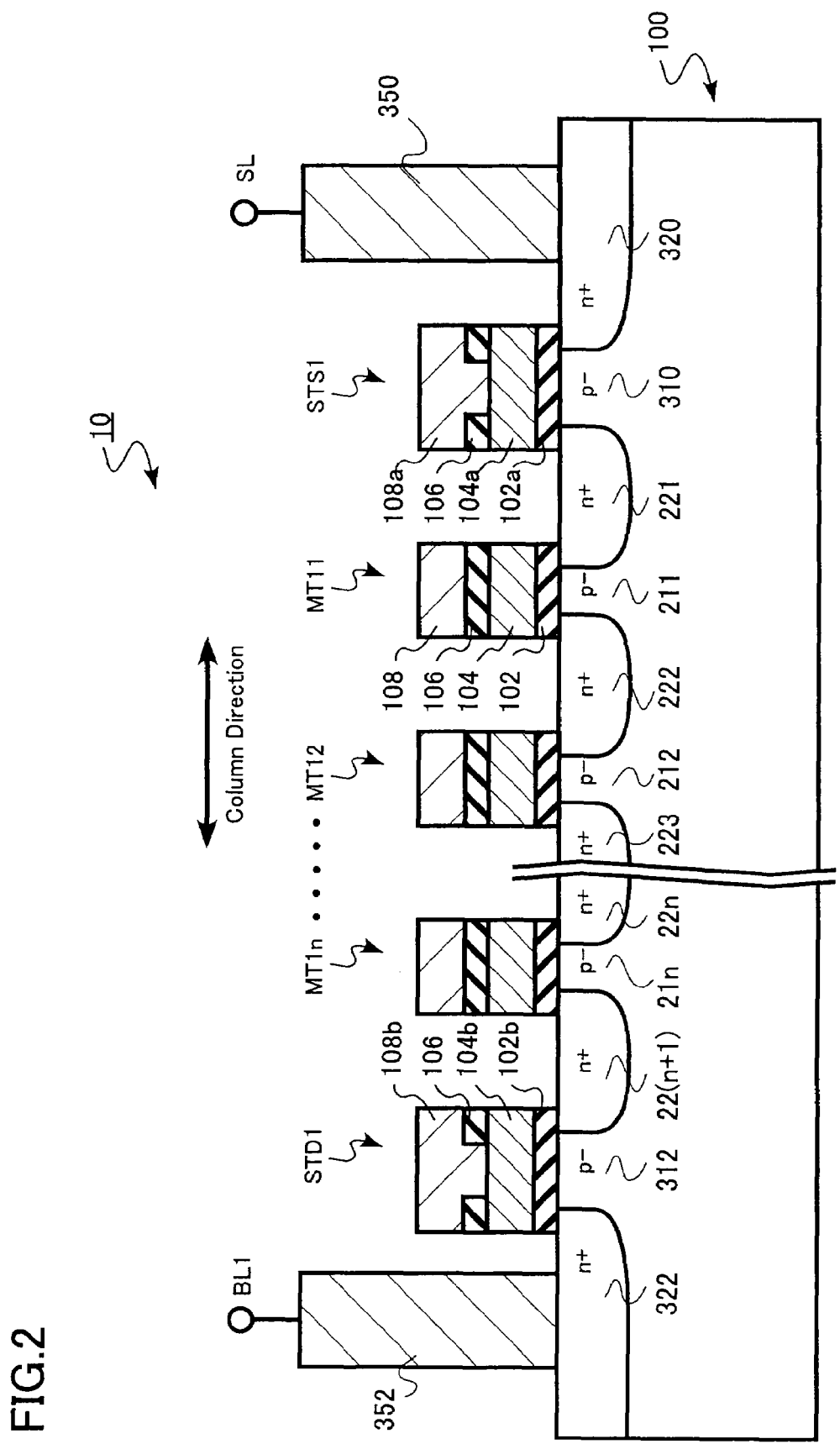
FIG. 2 is a cross-sectional view of the NAND flash memory of FIG. 1 as taken along line A-A.
Figure 3:
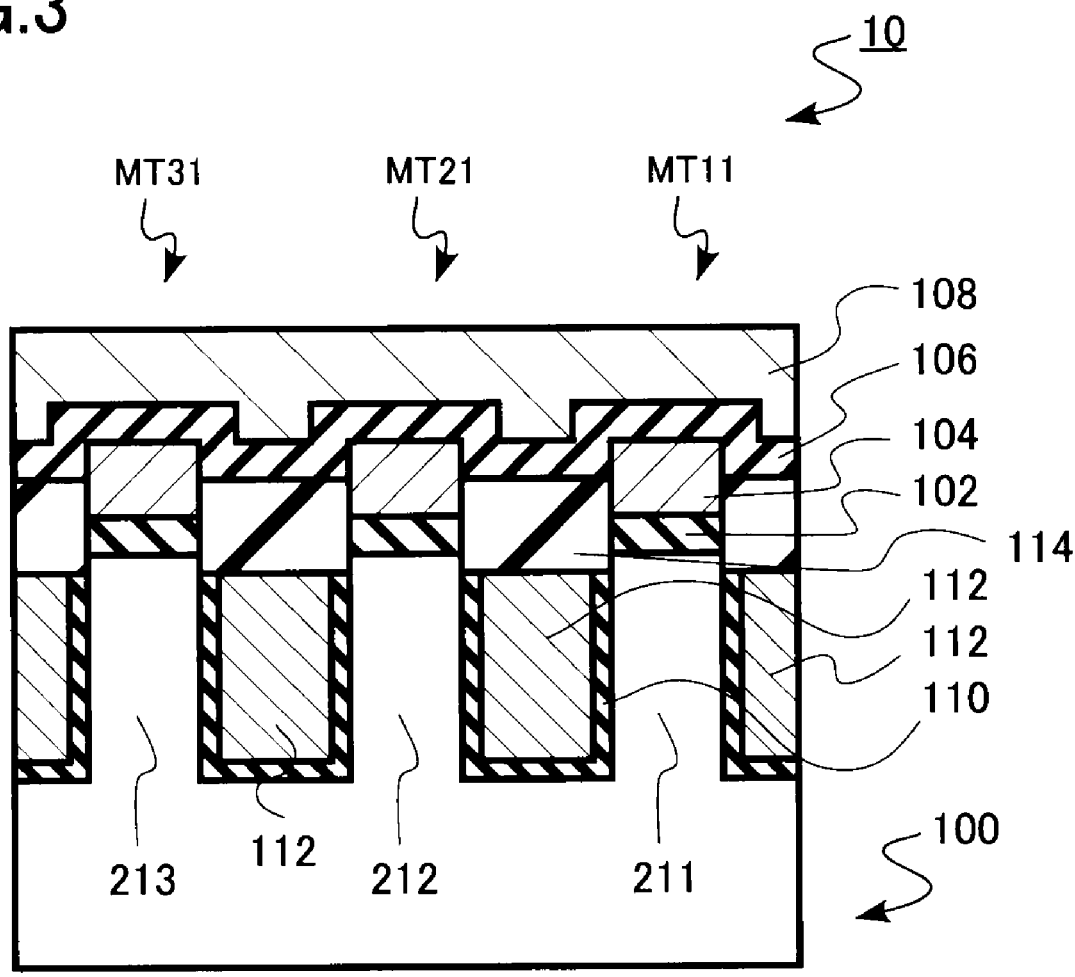
FIG. 3 is a sectional view of the NAND flash memory of FIG. 1 as taken along line B-B.

FIG. 1 is a top plan view of main part of a memory cell array of an electrically erasable programmable read-only memory (EEPROM) device 10 of the NAND type, also known as NAND flash memory, in accordance with one embodiment of this invention. FIG. 2 is a cross-sectional view of the NAND flash memory 10 of FIG. 1, which is taken along line A-A extending in a column direction. FIG. 3 is a sectional view of the NAND flash memory 10 as taken along line B-B in a row direction.

As shown in FIG. 1, the NAND flash memory 10 has on a semiconductor substrate a matrix array of rows and columns of one-transistor memory cells. These memory cells are at crossing points or intersections of parallel word lines WL1 to WLn and parallel bit lines BL1-BLm, where "n" and "m" are positive integers. The matrix includes serial combinations of memory cell transistors MT, which make up a plurality of NAND strings extending in the column direction, respectively.

As shown in FIG. 2, memory cell transistors MT11 to MT1n of one NAND string are arranged to have heavily-doped n (n$^+$) type diffusion layers for use as source and drain regions 221 to 22(n+1) which are formed in a surface of the substrate, e.g. p-type silicon substrate 100, and lightly-doped p (p$^-$) type channel regions 211 to 21n, each of which is laterally interposed between two adjacent ones of the source and drain regions 221-22(n+1). The memory cell transistors MT of NAND flash memory 10 are n-type transistors with electrons as the carriers thereof.

Each of the memory cell transistors MT11-MT1n also has a tunneling insulator film 102 which is provided on its corresponding one of the channel regions 211-21n, and an electrical charge storage or "accumulation" layer 104 on this tunnel insulator film 102. Each memory cell transistor further includes a control dielectric film 106 on the charge storage layer 104, and a control electrode 108 on the control dielectric film 106. In this way, the memory cell transistors MT11-MT1n are stack-gate MIS transistors.

Preferably, the tunnel insulator film 102 is made of a chosen insulative material having a high dielectric constant k (high-k), high voltage durability and increased reliability. Examples of the material are silicon oxide ($SiO_2$), silicon nitride ($Si_3N_4$), tantalum oxide ($Ta_2O_5$), titanium oxide ($TiO_2$), alumina ($Al_2O_3$), and zirconium oxide ($ZrO_2$).

The charge storage layer 104 is for accumulation of electrical charge indicative of digital data, sometimes called the memory information, and is made of polycrystalline silicon as an example. Alternatively, the charge storage layer 104 may be a film of charge-storable dielectric material rather than conductive material. An example of the dielectric material is silicon nitride ($Si_3N_4$). A nonvolatile semiconductor memory having such the charge storage layer 104 made of the nitride film is called the silicon oxide nitride oxide silicon (SONOS) type memory or the metal oxide nitride oxide silicon (MONOS) type memory in the semiconductor memory device art. The charge storage layer 104 may not always be formed of a continuous conductor body. For example, this layer may be formed of a discontinuous conductor, such as a silicon micro- or nano-crystal layer. A nonvolatile semiconductor memory having such charge storage layer made of silicon nanocrystal layer is called the silicon nanocrystal memory.

The control dielectric film 106 is made, for example, of $Si_3N_4$, $Ta_2O_5$, $TiO_2$, $Al_2O_3$, $ZrO_2$, oxide-nitride-oxide (ONO), phospho-silicate glass (PSG), boro-phospho-silicate glass (BPSG), silicon oxynitride (SiON), barium titanate (BaTiO$_3$), silicon oxide fluoride ($SiO_xF_y$) or organic resin, such as polyimide or the like. The control electrode 108 may be made of polycrystalline silicon, silicide of cobalt (Co) or nickel (Ni), or metal such as aluminum (Al) or copper (Cu) or else. Alternatively the electrode 108 may be formed of a multilayer film of poly-silicon and silicide or a stacked layer of poly-silicon and metal film or films.

As shown in FIG. 1, in the NAND flash memory 10, a predetermined number n ("n" is an integer) of neighboring memory cell transistors MT11-MT1n are laid out in the column direction. A respective one of these memory cell transistors MT11-MT1n has a pair of source and drain regions 22i and 22(i+1), each of which is commonized or "shared" by adjacent ones of memory cell transistors MT11-MT1n in the column direction. For example, a source/drain region 222 is shared by two neighboring cell transistors MT11 and MT12. A source/drain region 223 is shared by two adjacent cell transistors MT12 and MT13. A source/drain region 22n is shared by adjacent cell transistors MT1(n−1) and MT1n. These memory cell transistors MT11-MT1n are serially connected together to form a single NAND string. The memory cell array of NAND flash memory 10 has a plurality of such NAND strings, which are disposed in parallel to each other on the substrate 100.

See FIG. 3. This diagram is a sectional view of the NAND flash memory cell array as taken along line B-B of FIG. 1, which shows a row of memory cell transistors MT11, MT21, MT31, . . . . As shown herein, these memory cell transistors have channel regions 211, 212, 213, respectively. Each channel region has its vertical side faces, on which a dielectric film 110 is formed. On this sideface dielectric film 110, a corresponding one of spaced-apart sideface electrodes 112 with the channel region 211, 212, 213 being laterally interposed between adjacent ones of the sideface electrodes 112 is provided as an auxiliary electrode for expanding the operation margin of the NAND flash memory 10. When looking at one memory cell transistor MTij (where the suffix "i" is a given integer greater than or equal to 1 and less than or equal to m, and "j" is an integer greater than or equal to 1 and less than or equal to n), its channel region is laterally interposed by a couple of opposing sideface electrodes 112 associated therewith. The sideface electrodes 112 have top surfaces, on which an element isolation film 114 is formed. This element isolator film 114 is made of silicon oxide, for example. As for the element isolation, "air-gap" structure can be also applicable. In this case, the element isolator film 114 is eliminated and isolation is realized by the "air-gap" that has extremely low dielectric constant.

The sideface dielectric film 110 may be made of $SiO_2$, $Si_3N_4$, oxide-nitride-oxide (ONO) or the like. The sideface electrodes 112 may typically be made of poly-silicon.

One sideface electrode 112 is provided between the channels of two neighboring memory cell transistors in the row direction of the NAND flash memory cell array. In other words, the sideface electrode 112 is placed between a couple of adjacent NAND strings. As shown in FIG. 1, the sideface electrode 112 of each memory cell is commonized as sideface electrode lines SPL0, SPL1, SPL2 and SPL3, both in the electrical sense and in the physical sense. More specifically, the sideface electrode 112 is commonly used between a series-connected memory cell transistor that belongs to one NAND string and a series-coupled memory cell transistor belonging to another NAND string.

As shown in FIG. 2, the NAND string of memory cell transistors MT11-MT1n has opposite terminate ends in the column direction, at which two select gate transistors STS1 and STD1 are disposed. One select gate transistor STS1 is a MISFET having an $n^+$-type drain region 221 which is integral with the source region 221 of memory cell transistor MT11, a $p^-$-type channel region 310 that is disposed adjacent to the drain region 221, an $n^+$-type source region 320 that is placed adjacent to the channel region 310, and a select gate electrode which is formed of upper and lower conductive films 104a and 108a that are electrically coupled together. A source line contact 350 is provided on the source region 320 of the select gate transistor STS1. This contact is adjacent in position to transistor STS1.

The other select gate transistor STD1 of the NAND cell string shown in FIG. 2 is a MISFET having an $n^+$-type source region 22($n$+1) which is integral with the drain region 22($n$+1) of memory cell transistor MT1n, a $p^-$-type channel region 312 that is disposed adjacent to the source region 22($n$+1), an $n^+$-type drain region 322 that is placed adjacent to the channel region 312, and a select gate electrode which is formed of upper and lower conductors 104b and 108b that are electrically coupled together. A bit-line contact 352 is provided on the drain region 322 of select gate transistor STD1. This contact 352 is placed adjacent to transistor STD1.

As shown in FIG. 1, the memory cell array of NAND flash memory 10 includes a common source line SL, select gate lines SGS and SGD, and parallel word lines WL1 to WLn. These lines extend in the column direction. The source line SL is electrically connected to the source line contact 350 shown in FIG. 2. The select gate line SGS is electrically coupled to the gate electrode (104a, 108a) of the select gate transistor STS1 of FIG. 2. The wordlines WL1-WLn are connected to respective control electrodes 108 of memory cell transistors MT11-MT1n in NAND string. The select gate line SGD is coupled to the select gate electrode (104b, 108b) of select gate transistor STD1. Use of the wiring line layout constitutes the illustrative one NAND string.

As shown in FIG. 1, NAND strings Nos. 1 to 3 are associated with bit lines BL1 to BL3, respectively. These bitlines are connected to NAND strings #1-#3 at bitline contacts 352 thereof. Sideface electrode lines SPL0 to SPL3 are also provided in such a manner that each bitline is interposed between adjacent ones of these lines SPL0-SPL3.

Figure 4:
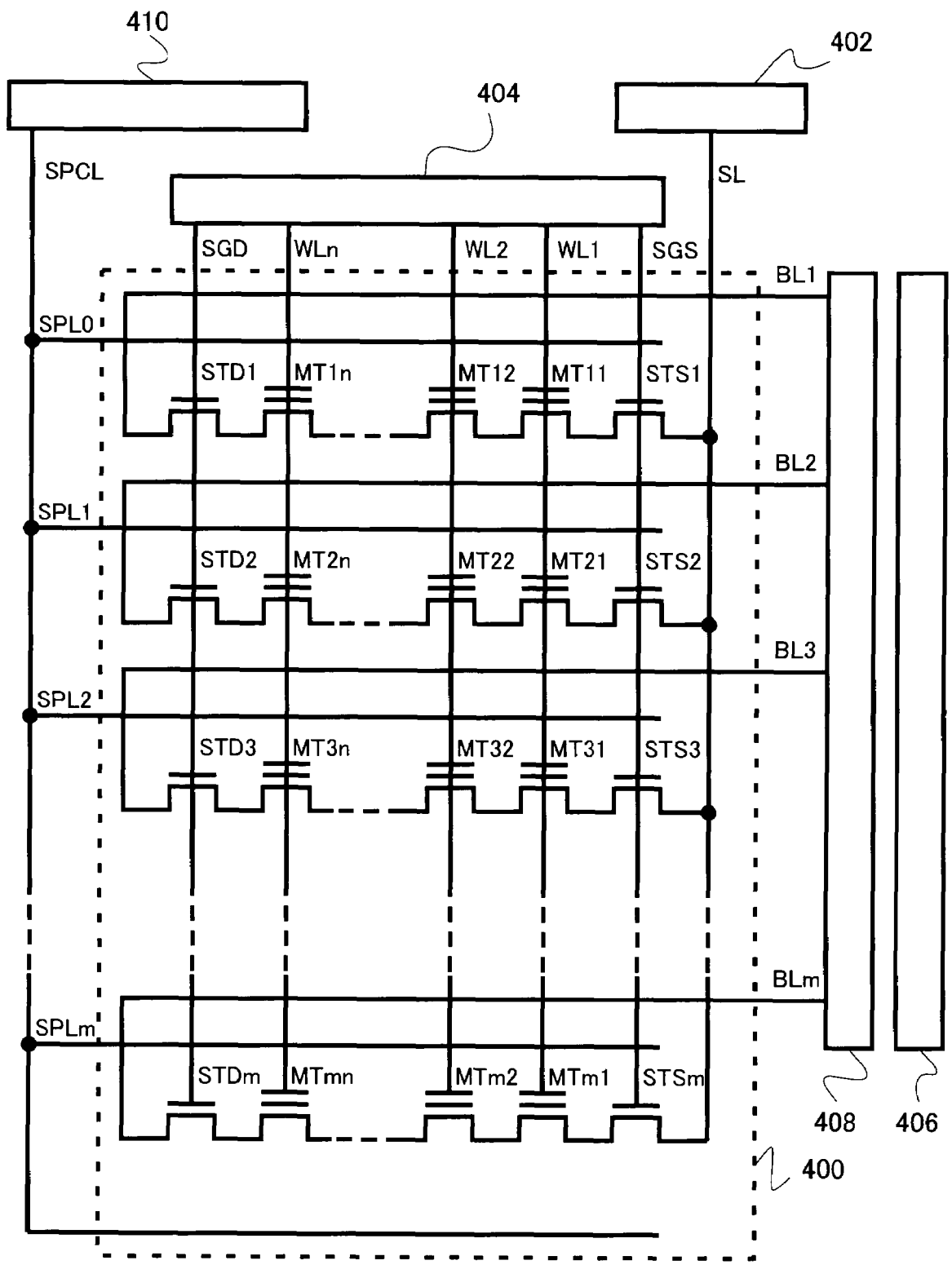
FIG. 4 is an equivalent circuit diagram of the NAND flash memory of FIG. 1.

Turning to FIG. 4, there is shown a configuration of electrical equivalent circuitry of the NAND flash memory 10 shown in FIGS. 1-3. A memory cell array 400 shown in FIG. 4 is configured from a matrix of m rows and n columns ("m" and "n" are integers) of memory cell transistors MT11 to MT1n, MT21 to MT2n, . . . , MTm1 to MTmn. These memory cell transistors MT may typically be stack-gate MISFETs.

In the memory cell array 400 of FIG. 4, the individual one of NAND strings is structured from a serial combination of memory cell transistors MTi1 to MTin ($1 \leq i \leq m$) and select gate transistors STSi and STDi. For example, NAND string #1 is made up of a series connection of memory cell transistors MT11-MT1n and select gate transistors STS1 and STD1. These select gate transistors STS1 and STD1 are at the opposite ends of the serial combination of memory cell transistors MT11-MT1n. More specifically, the select gate transistor STS1 has its drain region which is electrically connected to the source region of the "first" memory cell transistor MT11 for selection of this NAND string; the select gate transistor STD1 has its source region which is coupled to the drain region of the "last" memory cell transistor MT1n for selection of this NAND string. The remaining NAND strings are similarly arranged in a manner which follows: NAND string #2 is made up of a series connection of memory cell transistors MT21-MT2n and select gate transistors STS2 and STD2; NAND string #3 is made up of a series connection of memory cell transistors MT31-MT3n and select gate transistors STS3 and STD3; and NAND string #m is made up of a series connection of memory cell transistors MTm1-MTmn and select gate transistors STSm and STDm.

The select gate transistors STS1 to STSm are associated with a common source line SL connected thereto at the source regions thereof. This source line SL is coupled to a source line driver circuit 402, which supplies thereto a source voltage. Select gate transistors STS1 to STSm are connected together to a common select gate line SGS. Select gate transistors STD1 to STDm are coupled together to another common gate line SGD. These gate lines SGS and SGD and the word lines WL1 to WLn associated with respective columns of memory cell transistors MT11-MTm1, MT12-MTm2, . . . , MT1n-MTmn are connected to a row decoder circuit 404. This row decoder is responsive to receipt of a row address signal as input thereto, for decoding this signal to thereby generate a row address decode signal and for selectively supplying an operation voltage to the wordlines WL1-WLn and common gate lines SGS and SGD.

The select gate transistors STD1 to STDm have drain regions, which are associated with bit lines BL1 to BLm connected thereto, respectively. These bitlines BL1-BLm are connected to a column decoder circuit 406. This column decoder is operatively responsive to receipt of an input column address signal, for decoding this address signal to thereby generate a column address decode signal and for selecting based on this signal any one of the bitlines BL1-BLm at a time. The column decoder 406 is coupled to a sense amplifier circuit 408. This sense amp 408 amplifies data as read out of a one-transistor memory cell that is presently selected by the row decoder 404 and column decoder 406.

Further provided in the NAND flash memory 10 is a parallel combination of spaced-apart sideface electrode wiring lines SPL0, SPL1, SPL2, . . . , SPLm, which are associated with the NAND strings involved. As can be seen from FIG. 4, two adjacent ones of these sideface electrode lines SPL0-SPLm are associated with a corresponding one of the NAND strings, which is midway between these lines. For example, parallel sideface electrode lines SPL0 and SPL1 are associated with the NAND string #1, which is interposed therebetween; parallel sideface electrode lines SPL1 and SPL2 are for the NAND string #2, which is placed therebetween. These sideface electrode lines SPL0-SPLm are electrically connected to a sideface electrode common line SPCL, which in turn is coupled to a common driver circuit 410. This sideface electrode common driver 410 functions to supply a voltage to the sideface electrode common line SPCL.

An explanation will next be given of read, write and erase operations of the NAND flash memory 10 embodying the invention. In the explanation below, the threshold voltage Ve (volts) of a memory cell transistor is defined by a voltage potential level in the initial state (data is a logical "1") in which no electrons are stored at the charge storage layer 104 of the memory cell transistor MT11 shown in FIG. 3. Alternatively, when this transistor is set in another state that electrons are stored at the charge storage layer 104 (data is a logic "0"), the threshold voltage of memory cell transistor is given as Vp (volts). Assume here that the threshold voltage Ve is lower than zero (0) volts whereas the threshold voltage Vp is higher than 0 volts, i.e., Ve<0<Vp. First, an explanation will be given while taking as an example a two-value NAND flash memory device.

Suppose that one of the memory cells—here, a memory cell transistor MT11—is selected for data reading and writing. This memory cell transistor MT11 will be called the selected memory cell transistor whereas the remaining ones will be referred to hereinafter as unselected or "nonselected" memory cell transistors. A bit line BL1 connected to the selected memory cell transistor MT11 is called the selected bitline; a word line WL1 coupled thereto, a selected wordline. The other bitlines and wordlines coupled to the nonselected memory cell transistors MT21-MT2n, . . . , MTm1-MTmn are called the nonselected bitlines and nonselected wordlines.

Figure 5:
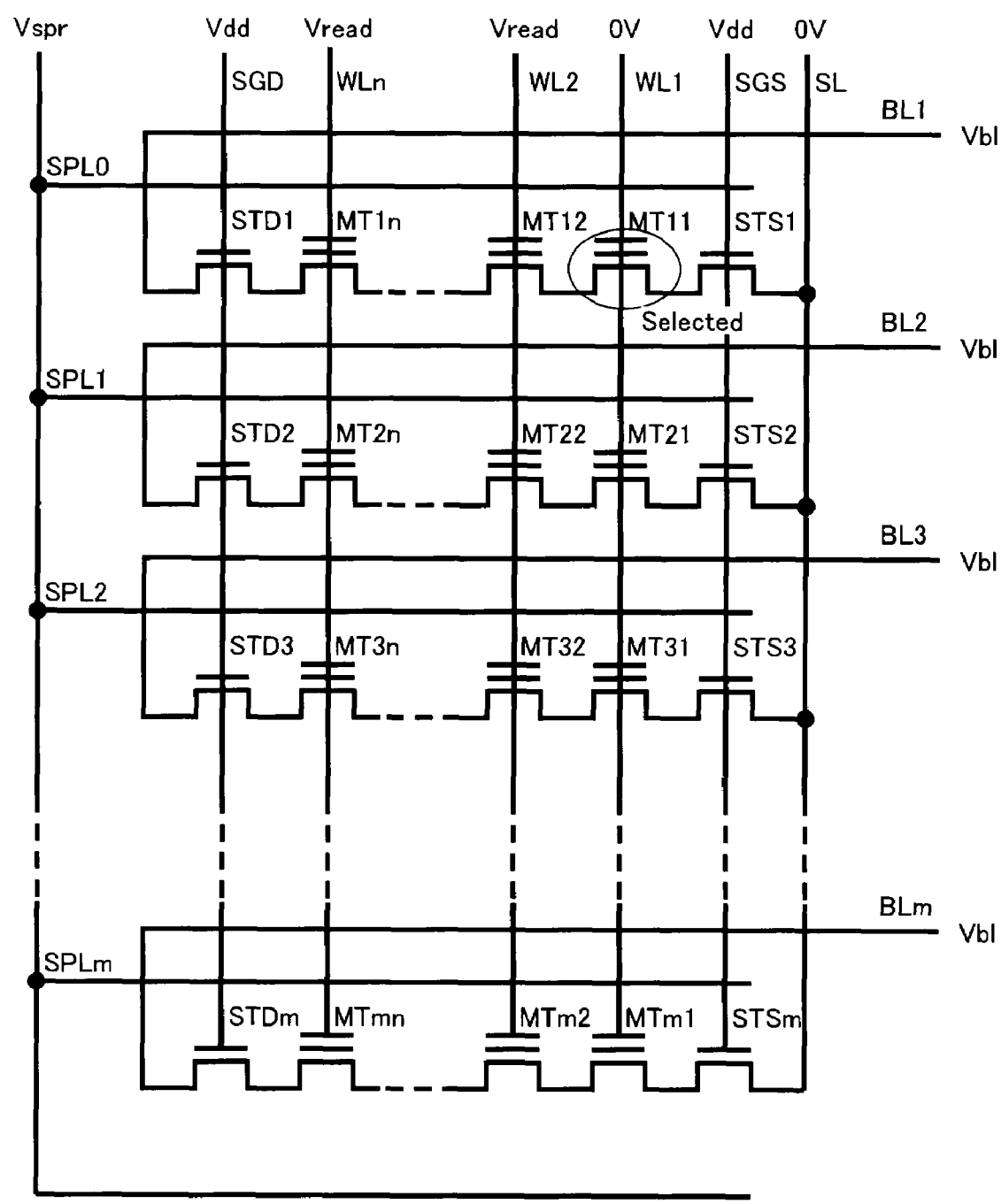
FIG. 5 is a circuit diagram for explanation of a read operation of the NAND flash memory of FIG. 1.

An exemplary read operation of the NAND flash memory device 10 will first be explained with reference to FIG. 5 and Table 1 presented below. Table 1 indicates several kinds of operation voltages of NAND flash memory 10. FIG. 5 is a circuit diagram in the event that NAND flash memory 10 is set in a read mode.

TABLE 1

| | State | | |
|---|---|---|---|
| Line | Read | Write | Erase |
| SL | 0 V | Vdd | Floating |
| SGS | Vdd | 0 V | Floating |
| WL1(select) | 0 V | Vpgm | 0 V |
| WL2-WLn(unselect) | Vread | Vpass | 0 V |
| SGD | Vdd | Vdd | Floating |
| BL1(select) | Vbl | 0 V | Floating |
| BL2-BLn(unselect) | Vbl | Vdd | Floating |
| Substrate | Vbb | Vbb | Vera |
| SPL0-SPLm | Vspr | Vspw | Vera |

A back-gate voltage Vbb is being applied to the semiconductor substrate as shown in Table 1. The back-gate voltage Vbb is set, for example, at zero volts (0V). The bitlines BL1 to BLm are applied a precharge voltage Vb1, which is set to +0.7V, for example. The common source line SL is set at 0V.

The select gate line SGS shown in FIG. 5 is applied a power supply voltage Vdd (e.g., +3.3V), causing the select gate transistors STS1 to STSm to turn on. Then, a 0-V voltage of common source line SL is transferred to the memory cell transistors MT11, MT21, . . . , MTm1. The supply voltage Vdd (e.g., +3.3V) is also applied to select gate line SGD so that select gate transistors STD1 to STDm are driven to turn on, resulting in the precharge voltage (e.g., +0.7V) of bitlines BL1 to BLm being sent forth toward memory cell transistors MT1n, MT2n, . . . , MTmn, respectively.

The non-selected wordlines WL2-WLn are applied a voltage Vread which is higher in potential than the supply voltage Vdd—for example, +5V. With this voltage application, non-selected memory cell transistors MT12-MT1n, MT21-MT2n, . . . , MTm1-MTmn are forced to turn on. Thus, these nonselected transistors function as data transfer transistors.

The selected wordline WL1 is applied a voltage of 0V. This results in the selected memory cell transistor MT1 being set to 0V at its control electrode 108 (see FIG. 2). This transistor is of the so-called depression type, wherein the threshold voltage Ve of selected memory cell transistor is lower in potential than 0V when its charge storage layer 104 stores no electrons (i.e., when the data is a logic 1). For this reason, even when the voltage applied to control electrode 108 is 0V, the selected memory cell transistor MT11 turns on, allowing a channel current to flow therein.

On the other hand, when electrons are stored at the charge storage layer 104 (i.e., when data is a logic 0), the threshold voltage Vp of selected memory cell transistor MT11 is potentially higher than 0V. Thus, this selected cell transistor MT11 turns off, resulting in no channel current flowing therein.

Accordingly, if a channel current flows in the selected memory cell transistor MT11, its present state is determined to be an erase state (data is a logic 1). On the contrary, if no channel current flows therein, this memory cell is decided to be in a write state (data is a logic 0). In the NAND flash memory 10 of the illustrative embodiment, a prespecified potential level of drive voltage Vspr is applied to the sideface electrode lines SPL0 to SPLm while several kinds of voltages are applied to respective electrodes. This read-event sideface electrode drive voltage Vspr is set to −1V as an example. With this Vspr voltage application, it is possible for the NAND flash memory 10 to improve the read margin thereof.

Figure 8:
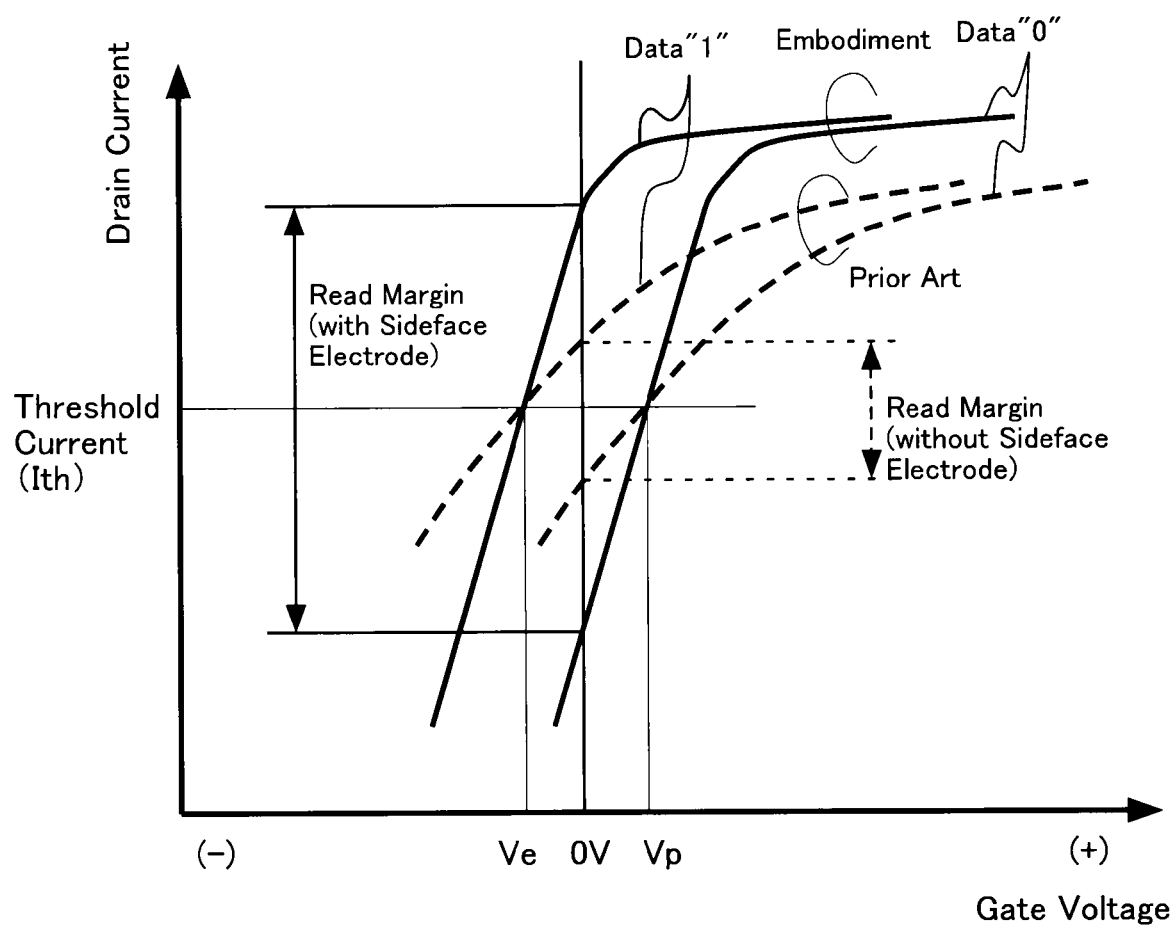
FIG. 8 is a graph showing the read margin of the NAND flash memory shown in FIG. 1.

FIG. 8 is a graph showing the read margin of NAND flash memory 10 embodying the invention. The lateral axis of this graph indicates a gate voltage whereas the vertical axis indicates a drain current. Solid-line curves indicate current-versus-voltage (I-V) characteristics of a memory cell transistor of the NAND flash memory 10 having the sideface electrodes, one of which curves is in the case of logic "1" data and the other of which is in the case of logic "0" data. Dot-line curves plotted in the graph of FIG. 8 indicate I-V characteristics of a prior known memory cell transistor with no such sideface electrodes, in the case of logic 1 data and in the case of logic 0 data.

As previously stated, the decision of read data—i.e., whether the data is a logic 1 or a logic 0—is performed by monitoring the amount of a channel current flowing upon application of 0V to the control electrode of a presently selected memory cell transistor. Accordingly, the data read margin increases or "expands" as a difference becomes greater in magnitude between the channel current in the case of data 1 and the channel current in the case of data 0.

As the memory cell transistors become smaller in dimensions, the distance between source and drain regions decreases, resulting in short channel effects becoming more appreciable. A decrease in source/drain distance leads to degradation of NAND flash memories in cut-off characteristics as in the case of the prior art device indicated by dotted curves in FIG. 8. As apparent from viewing FIG. 8, the cutoff characteristics degradation results in a decrease in difference between the channel current flowing in the case of data 1 and the channel current flowing in the case of data 0, causing the read margin to become smaller unwantedly. One simple approach to improving the cutoff characteristics is to apply a negative bias to the back-gate to thereby achieve what is called the substrate bias effect in channel regions.

However, in case the channel region 211 shown in FIG. 3 decreases in width (i.e., NAND string width), the area of a contact between the substrate region 100 of FIG. 3 and its channel region becomes narrower by a degree of such miniaturization. Also narrowed by the degree of downscaling is the width of a channel region which covers from the substrate region 100 up to a region immediately beneath the tunnel insulator film 102, in which region the channel is actually formed. Due to this width reduction, electrical resistance increases in value. This poses the following risk: the bias voltage applied to the back-gate (substrate region) fails to be effectively transferred to the region in which the channel is actually formed. Therefore, with mere use of the means for achieving the substrate bias effect only by simple back-gate bias application, it becomes difficult for highly miniaturized memory cell transistors to improve the cutoff characteristics while retaining enhanced controllability.

In addition, due to the presence of possible micro-fabrication process variability, memory cell transistors formed can vary in channel width values, resulting in an unwanted change in contact area of the substrate region and the channel region. This contact area change causes the back-gate bias voltage being substantially applied to the channel region to become variable between the memory cell transistors, resulting in occurrence of irregular variations of the cutoff characteristics between the memory cell transistors. Similarly, in view of the fact that the channel region in which the channel is actually formed is physically spaced apart from the substrate region by a certain degree of distance, if crystal defects and/or fixed charge caused by unintentional impurities are present within this distance, the substrate voltage can locally vary in potential, causing the substrate bias effect to become irregular between the memory cell transistors. The cutoff characteristics variation between memory cell transistors causes nonvolatile memory device products to be narrowed in read margin.

The NAND flash memory 10 embodying the invention is specifically arranged so that two opposing sideface electrodes 112 are provided on two side surfaces of the channel region of each memory cell transistor MTij, with the sideface dielectric film 110 being interposed between the channel region and sideface electrode 112 as better shown in FIG. 3, wherein the negative voltage Vspr (e.g., −1V) is applied to the sideface electrodes 112. With this arrangement unique to the embodiment device, it is possible to achieve the substrate bias effect by the back-gate bias from the channel bottom surface and, simultaneously, realize the substrate bias effect from the side faces owing to the use of the sideface electrodes 112. Thus it becomes possible to improve the cutoff characteristics of memory cell transistors. This in turn makes it possible to enlarge the difference between the channel current flowing in the case of data 1 and the channel current flowing in the case of data 0 even in cases where these transistors have the threshold voltages Ve and Vp that are the same as the prior art, as well demonstrated by the graph of FIG. 8. Thus, the memory cell transistors are improved in margin of read operation. Another advantage of the embodiment is as follows. As the individual sideface electrode 112 is placed closer to its associated channel region than to the substrate region, it is possible to suppress irregular variations of the substrate bias effect otherwise occurring due to channel width changes and substrate potential variations. Furthermore, by providing the sideface electrodes 112, the substrate bias effect of the channel region is kept stable or "stabilized." Thus, unwanted variation of the cutoff characteristics between memory cell transistors is prevented or at least greatly suppressed, thereby enabling NAND flash memory products to improve in the read operation margin thereof.

It should be noted that when looking at a one memory cell transistor, the cutoff characteristics continues to improve when the absolute value of an externally applied negative back-gate bias voltage is continuously increased while at the same time letting it stay within a specific range which prevents a read current value from excessively decreasing due to an excessive increase in channel turn-on resistance. However, the potential drop due to such back-gate bias has already extended to those regions other than the memory cell transistor of interest. Hence, the advantage of the above-stated approach to improving the cutoff characteristics by simple enlargement of the absolute value of the back-gate bias does not come without accompanying the penalty of an unintentional increase in leakage current of p-n junction in such regions other than the memory cell transistor of interest. As apparent from the foregoing discussion, the technique for achieving the substrate bias effect at the channel part by sole use of the back-gate lacks the controllability required and, for this reason, fails in most cases to offer the intended ability to improve the cutoff characteristics of memory cell transistors.

Figure 6:
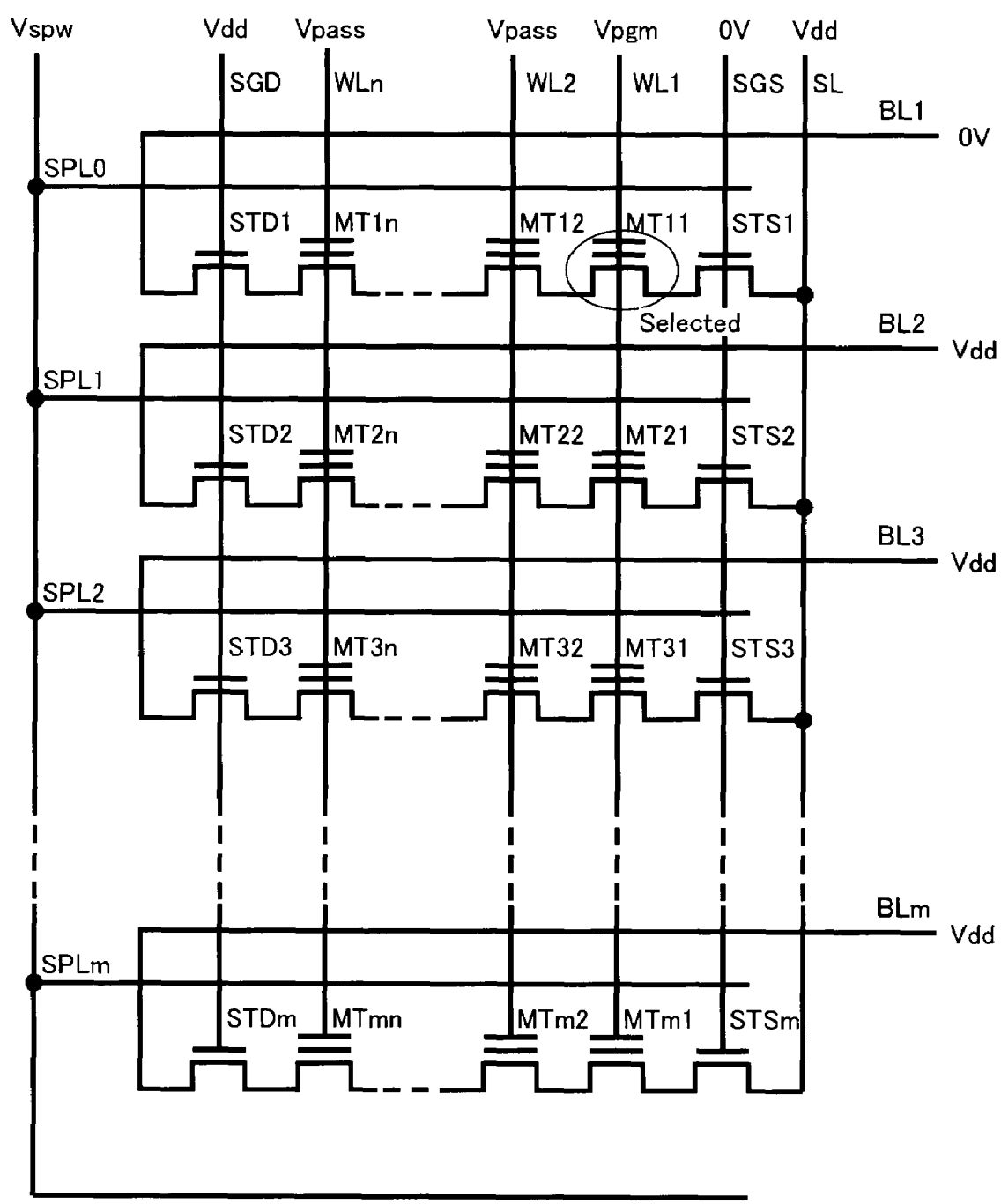
FIG. 6 is a circuit diagram for explanation of a write operation of the NAND flash memory of FIG. 1.

An explanation will next be given of one example of a write operation of the NAND flash memory 10 with reference to Table 1 and FIG. 6. FIG. 6 is a circuit diagram during the write operation of NAND flash memory 10.

The semiconductor substrate (Sub) is applied a back-gate voltage Vbb, e.g., 0V. Simultaneously, a voltage of 0V is applied to a presently selected bit line BL1; the supply voltage Vdd (e.g., +3.3V) is applied to the common source line SL. When the select gate line SGS is set at 0V, the select gate transistor STS1 turns off, causing source line SL to become in the cut-off state. The supply voltage Vdd (e.g., +3.3V) is applied to the select gate line SGD, causing the select gate transistor STD1 to turn on. Thus, a voltage potential, i.e., 0V, of the selected bitline BL1 is transferred to memory cell transistor MT1n.

While the selected word line WL1 is applied a write or "program" voltage Vpgm, an intermediate potential level of voltage Vpass is applied to nonselected wordlines WL2-WLm. The write voltage Vpgm may be set at +18V whereas the mid-level voltage Vpass is +10V. With this voltage application, both the selected memory cell transistor MT11 and the nonselected memory cell transistors MT12-MT1n are all driven to turn on, causing the 0V of the selected bitline BL1 to be transferred.

At the selected memory cell transistor MT11, the write voltage Vpgm (e.g., +18V) is applied to its control electrode 108 shown in FIG. 2. By this voltage application, a high electrical field is created between the charge storage layer 104 and the channel region 211 immediately beneath this charge storage layer 104, to which the 0V is being transferred from the selected bitline BL1. This causes electrons to be injected into the charge storage layer 104 via the tunnel insulator film 102. When the electrons are injected into charge storage layer 104, the threshold voltage of the selected memory cell transistor MT11 changes from the negative threshold voltage Ve to the positive threshold voltage Vp, resulting in establishment of logic "0" data being written or "programmed" in the selected memory cell transistor MT11. This is called the write state.

During the data writing, the supply voltage Vdd (e.g., +3.3V) is applied to the nonselected bitlines BL2-BLm. Here, the select gate line SGS is set at 0V, causing the select gate transistors STS2-STSm to turn off. Thus, the common source line SL is set in the cutoff state.

The select gate line SGD is applied the supply voltage Vdd (e.g., +3.3V), causing the select gate transistors STD2-STDm to turn on. Thus, a specific potential level of voltage is transferred to nonselected memory cell transistors MT21-MT2$n$, . . . , MTm1-MTmn, wherein the potential level is equivalent to a difference between the supply voltage Vdd of nonselected memory cells BL2-BLm and the threshold voltage Vth of select gate transistors STD2-STDm, that is, 3.3-Vth (volts).

As the select gate transistor SGS is set in the cutoff state, a potential difference between the gate voltage of each of the select gate transistors STD2-STDm and the above-noted source voltage transferred becomes equal to Vth (=Vdd−(Vdd—Vth)). Accordingly, in this state, the select gate transistors STD2-STDm are also set in the cutoff state.

When the select gate transistors STD2-STDm and select gate transistors STS2-STSm are cut off, the nonselected memory cell transistors MT21-MT2$n$, . . . , MTm1-MTmn are such that their channels are rendered conductive (turned on) while these transistors become floating—namely, they are in the electrical floating state—from the common source line SL and bitlines BL2-BLm. In this event, the channel potential that has become floating due to the coupling of Vpgm and Vpass is caused to rise up. A degree of this potential riseup is higher than or equal to Vdd and yet less than or equal to Vpass; for example, 7V.

As the nonselected memory cell transistors MT21-MT2$n$, . . . , MTm1-MTmn are increased in channel potential in this way, the potential difference between the channel region and the charge storage layer 104 of each of the nonselected memory cell transistors MT21-MTm1 stays less even when the write voltage Vpgm (e.g., +18V) is applied to the control electrodes 108 of nonselected memory cell transistors MT21-MTm1. This ensures that no electrons are injected into the charge storage layers 104 of nonselected memory cell transistors MT21-MTm1.

In addition to the voltage application to respective electrodes in the NAND flash memory 10, a specific potential level of positive voltage is applied to the sideface electrode lines SPL0, SPL1, SPL2, . . . , SPLm. This voltage is referred to as the write-event sideface electrode drive voltage Vspw (e.g., +0.5V). With the application of this positive voltage Vspw, it is possible to improve the NAND flash memory 10 in write margin.

As the memory cell transistors shrink in dimensions, the serially coupled memory cell transistors of NAND strings increase in electrical resistances of channels and source/drain diffusion layers. One reason of this resistance increase is a decrease in channel width and diffusion layer width. Another reason is that the source/drain diffusions are designed to have a reduced depth in order to suppress short-channel effects otherwise occurring due to the transistor minimization. One remedy considered is to employ the device design for increasing the impurity concentration of such depth-reduced or "shallowed" diffusion layers in such a way as to compensate for a decrease caused by the diffusion layer depth reduction to thereby avoid resistance increases of the diffusion layers. However, the impurity concentration increase is faced with the risk that self-boosting is disturbed during writing due to an unwanted increase in a tunneling current flowing between a channel region and diffusion layer, known as the band-to-band tunnel current. In view of this, it is not preferable to merely increase the concentration of diffusion layers. It is thus required to shallow the diffusion layers while letting them stay low in concentration.

When an attempt is made to shallow the diffusion layers while letting them stay low in concentration, the diffusion layers decrease in number of impurity atoms for use as donors due to the occurrence of random fluctuation phenomena of such impurity atoms. In that case, when the number of impurity (donor) atoms in the diffusion layers is fluctuated toward the reduced direction, it results in a drastic increase in electrical resistance of the diffusion layers. Similarly, the channel resistance can drastically increase, when the number of impurity (acceptor) atoms in the channel is fluctuated towards the increased direction due to the random fluctuation phenomena of impurity atoms.

In accordance with the NAND flash memory 10 embodying the invention, it is possible, by application of a positive voltage from the sideface electrodes to channel regions, to facilitate channel formation of memory cell transistors, thereby enabling reduction of the channel resistance. In addition, by applying a positive voltage to the diffusion layers from sideface electrodes, it becomes possible to reduce or minimize the diffusion layer resistance.

Thus, it is possible to prevent or at least greatly suppress unwanted potential changes of the write voltage Vpgm sent from a selected bitline otherwise occurring due to the presence of the channel resistance and the diffusion layer resistance. This makes it possible to enhance the write margin of the NAND flash memory 10.

Figure 7:
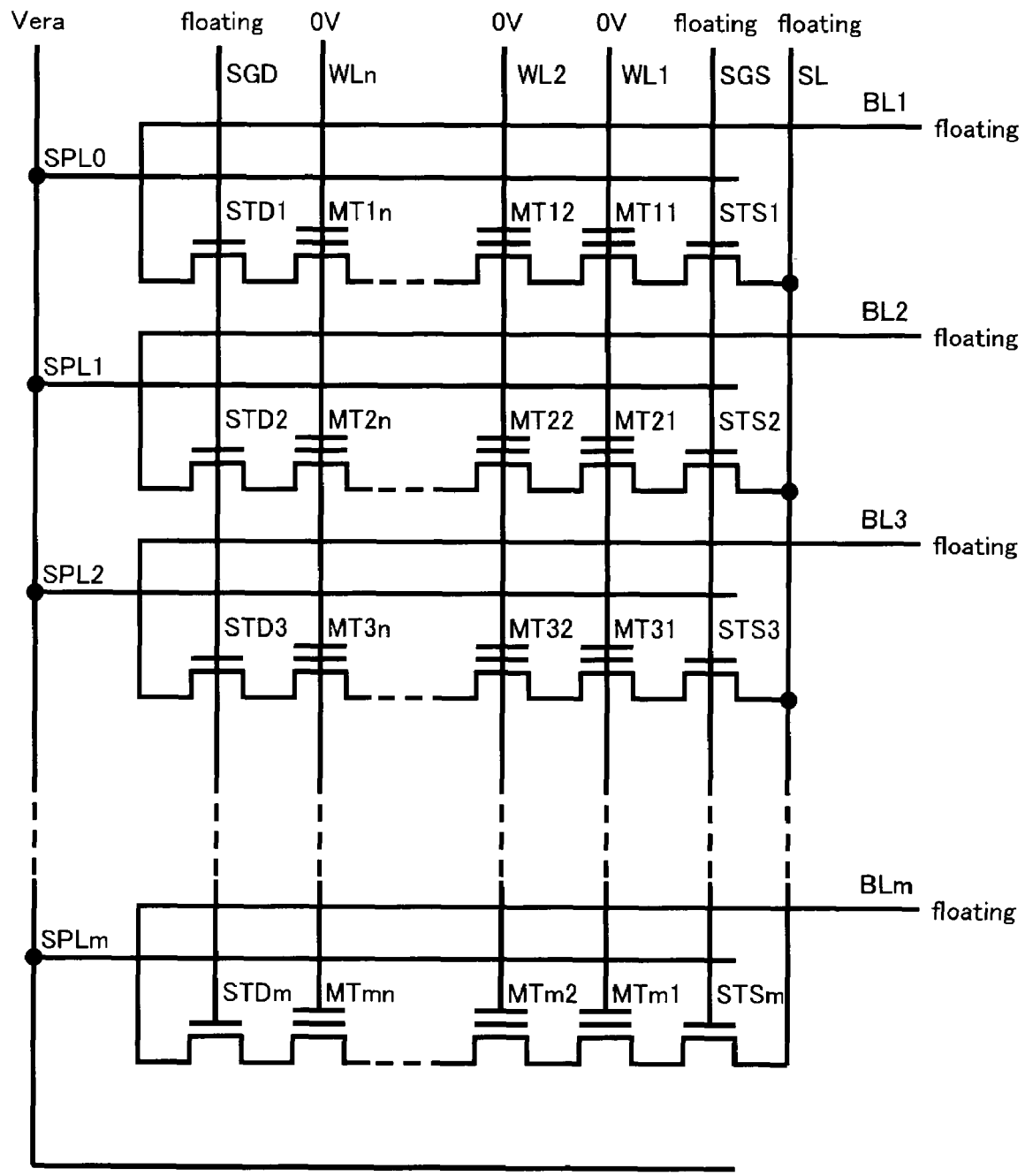
FIG. 7 is a circuit diagram for explanation of an erase operation of the NAND flash memory of FIG. 1.

Next, an explanation will be given of an exemplary erase operation of the NAND flash memory 10 while referring to FIG. 7 along with Table 1. FIG. 7 is a circuit diagram during the erase operation of NAND flash memory 10. In most NAND flash memory devices, it is possible to erase all of the memory cell transistors within a selected block at a time. This is called the block erase. The explanation here assumes that the memory cell transistors MT11-MT1$n$, MT21-MT2$n$, . . . , MTm1-MTmn in the memory cell array 400 shown in FIG. 4 are erased together simultaneously. This is known as the "all-at-a-time" erase or, alternatively, "all-at-once" erase in the flash memory device art.

In the all-at-once erase session, all the bitlines BL1-BLm and the common source line SL plus the select gate lines SGS and SGD are set and retained in the electrical floating state. The semiconductor substrate (Sub) is applied an erase voltage Vera (e.g., +20V). This erase voltage is also applied to the sideface electrode wiring lines SPL0-SPLm. All the wordlines WL1-WLn are set at 0V.

With this biasing condition, electrons are ejected from the charge storage layer 104 (see FIG. 2) of each memory cell transistor MTij via its associated tunnel insulator film 102. This electron ejection from charge storage layer 104 causes the threshold voltage of every memory cell transistor to become equal to the negative threshold voltage Ve, resulting in each cell transistor being set in the erase state (i.e., logic "1" data storing state). Thus, all the memory cell transistors MT11-MT1$n$, MT21-MT2$n$, . . . , MTm1-MTmn are erased together at a time.

Very importantly, in the case of the NAND flash memory 10, the erase voltage Vera (e.g., +20V) is also applied to the sideface electrode lines SPL0-SPLm whereby electrons are released from the individual charge storage layer 104 into its associated sideface electrodes 112 also, through either the element isolator film 114 or the sideface dielectric film 110. Additionally, the application of the erase voltage Vera to sideface electrodes 112 ensures that the channel region becomes stable in surface potential. This makes it possible to improve the efficiency of electron ejection and injection into the channel region. Thus it becomes possible to noticeably increase the stability and reliability of erase operations when compared to prior art memory devices.

It should be noted that the voltage to be applied to the sideface electrodes 112 is not always equal to the erase voltage Vera. When the need arises, such voltage may alternatively be set to be lower in potential than the erase voltage Vera. With such lower voltage application, similar results are obtainable as to the channel region surface potential stability.

The read, write and erase operations of NAND flash memory 10 stated above are such that respective functions and advantages are obtainable independently of each other. For example, in cases where it is required to improve only the margin of read operation, the sideface electrodes 112 may be set at 0V during write and erase operations. Alternatively, the sideface electrodes 112 may be forced to stay in the electrically floating state with no voltages applied thereto.

Although in the description above the one-cell/two-value NAND flash memory 10 was shown as an example of the nonvolatile semiconductor memory device embodying the invention, the principal feature of using the sideface electrodes as auxiliary electrodes unique to the invention may also be applied effectively to multi-level (or multi-value) NAND flash memory devices.

Figure 9A:
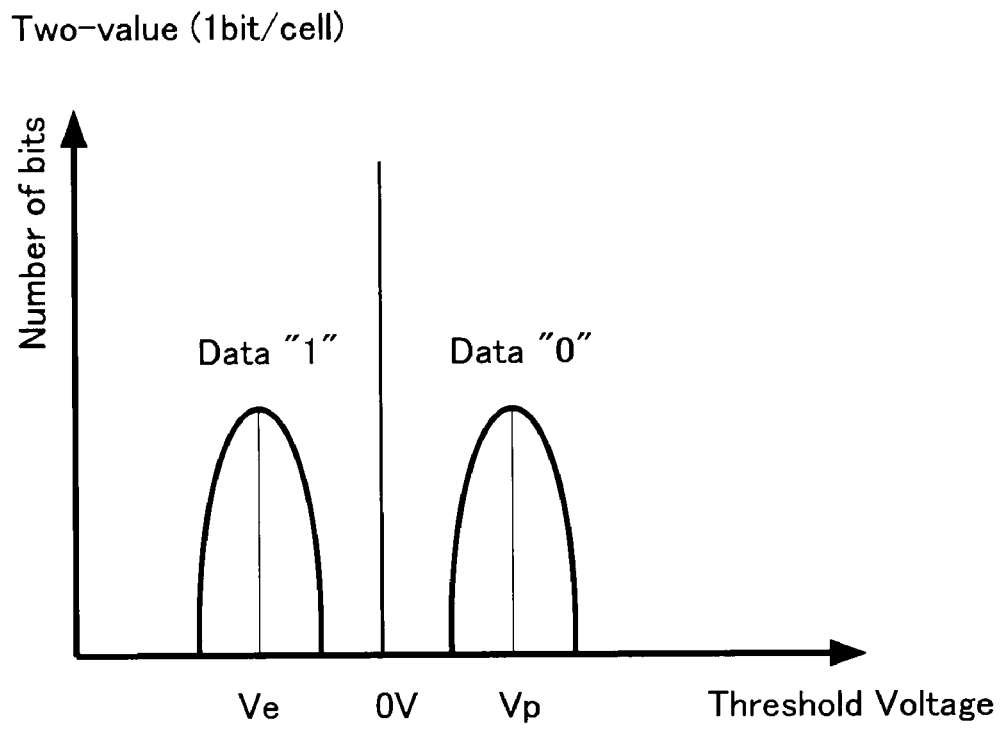
FIGS. 9A and 9B are graphs each showing a threshold value distribution of a standard nonvolatile semiconductor memory device.
Figure 9B:
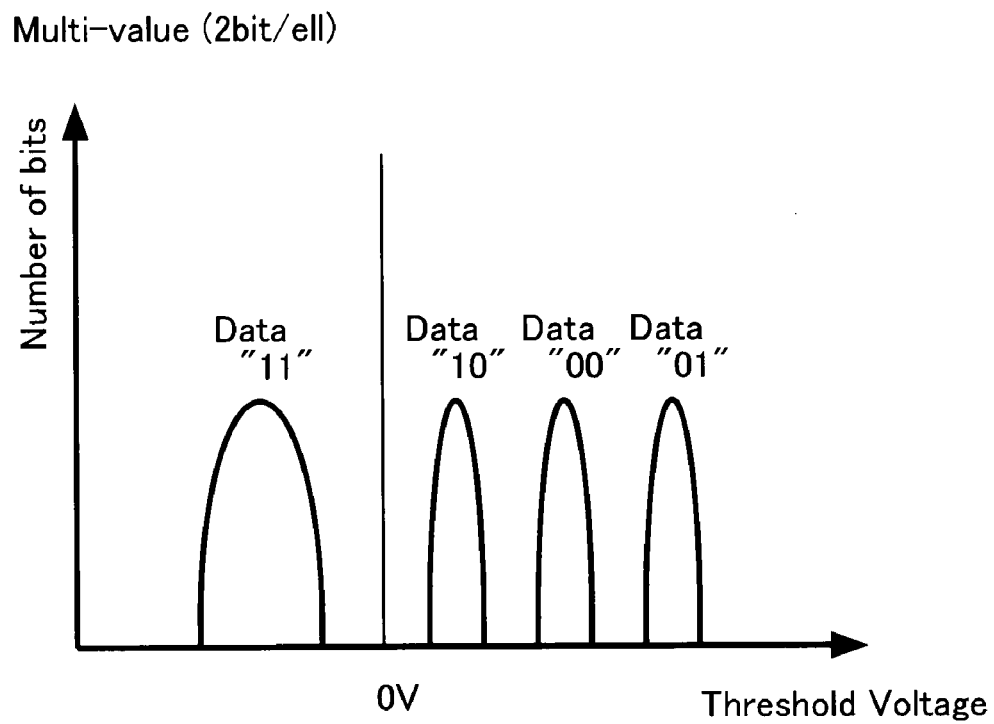

FIGS. 9A and 9B are graphs each showing a memory cell transistor threshold voltage distribution of NAND flash memory. FIG. 9A is in the case of a standard two-value NAND flash memory (i.e., one bit of data is stored per cell) whereas FIG. 9B is in the case of a multi-level NAND flash memory (e.g., two bits of data per cell). In each graph, the vertical axis indicates the number of data bits whereas the lateral axis indicates threshold voltage.

As shown in FIG. 9A, in the case of two-value data being stored per memory cell, the threshold voltage distribution is divided into two separate curves, one of which is for logic "1" data and the other of which is for logic "0" data. On the contrary, in the case of four-level (or four-value) data per cell, the threshold voltage distribution has four separate curves for individual data bits "11," "10," "00," and "01," respectively, as shown in FIG. 9B.

Accordingly, the multi-level memory becomes less than two-level memory in threshold voltage difference between different data bits, resulting in likewise decreases in margins of read and write operations. In view of this, the above-stated read/write margin expandability of the NAND flash memory 10 is effective, in particular, for multi-level NAND flash memory devices.

Another advantage of the NAND flash memory 10 lies in its ability to suppress or minimize an unwanted increase in area of chip substrate, also known as chip area, otherwise occurring due to additional use of the sideface electrodes 112 which are for use as auxiliary electrodes. This can be the because each sideface electrode is provided between two adjacent ones of NAND strings and also is commonly used or shared by serially connected memory cell transistors. Typically, a surface area of semiconductor substrate between NAND strings is the region that is needed to bury or embed therein an element isolation film in order to attain electrical separation between neighboring NAND strings. Consequently, additional formation of buried sideface electrodes in this area does not result in an appreciable increase in chip area.

Also importantly, by the commonization of a sideface electrode between series-coupled memory cell transistors in the form of a sideface electrode wiring line, it is no longer required to provide electrical contacts for each individual memory cell, which contacts are for voltage application to the sideface electrodes. This means that what is required here is to provide only one contact per sideface electrode line, rather than per memory cell transistor. This also contributes to the minimization of the increase of a chip area.

While in this embodiment the NAND flash memory 10 is arranged to apply the same voltage to all the sideface electrode wiring lines in its memory cell array, the embodiment memory may be modified to additionally employ a decoder circuit which selectively applies a prespecified potential level of voltage to a desired one of the sideface electrode lines. With such the decoder arrangement, voltage is not applied to those sideface electrode lines which are not directly concerned to the improvement of operation margins. Thus it is possible to lessen power consumption of the memory chip as the whole. It is also possible to shorten the length of a time which is taken for charge-up of the electrode line(s). This can speed up the operations of the NAND flash memory 10, when compared to a memory configuration with the voltage being unconditionally applied to every sideface electrode. Furthermore, by designing not to apply the voltage to sideface electrode line other than the sideface electrode line associated with the NAND string of interest, it is possible to prevent the operation margin from becoming narrowed undesirably.

Preferably, the individual sideface electrode is commonized between certain memory cell transistors which belong to the same cell block that is a one unit for data erase. This is because unintentional data erase can take place if such electrode is commonized by those memory cell transistors belonging to different cell blocks, which are subjected to all-at-once erase separately. Note here that this contraction for electrode commonization is not applied in a case where the sideface electrode is not used as the auxiliary electrode for application of the erase voltage Vera during erase operations.

Also preferably, the tunnel insulator film 102 is less than the sideface dielectric film 110 in effective oxide thickness (EOT)—typically, in $SiO_2$ equivalent thickness. This is needed, in particular, in order to avoid risks of operation errors occurring due to the formation of either an inversion layer or a channel at the side surface(s) of a transistor channel region during read operations.

Figure 10A:
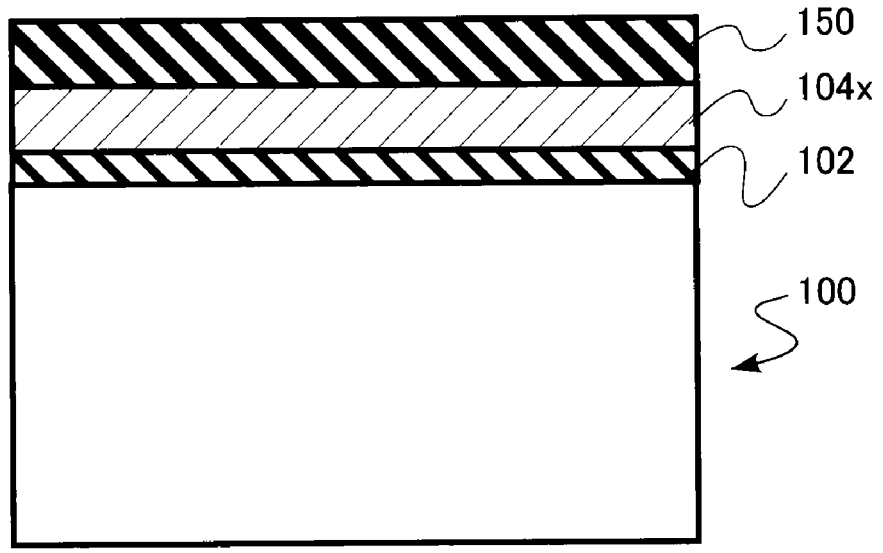
FIGS. 10A through 19B illustrate, in cross-section, some major process steps in the manufacture of the NAND flash memory of FIG. 1.
Figure 10B:
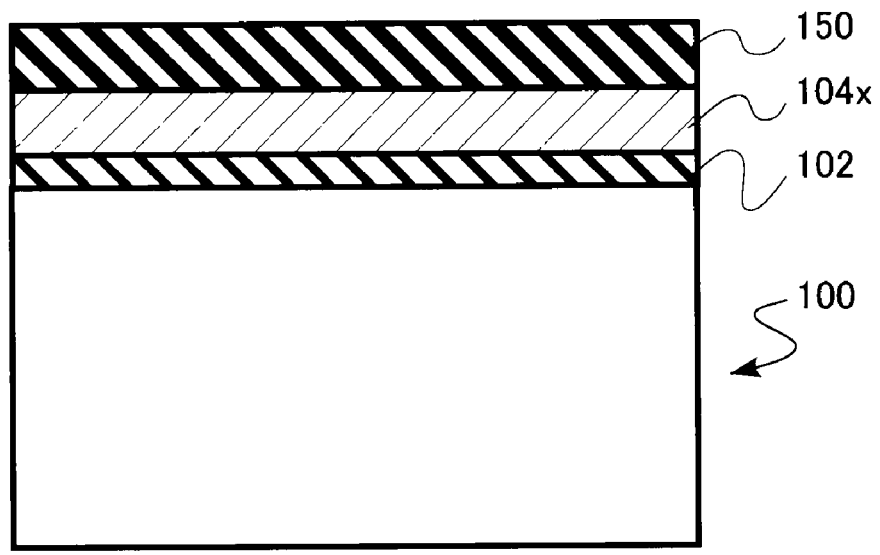
Figure 11A:
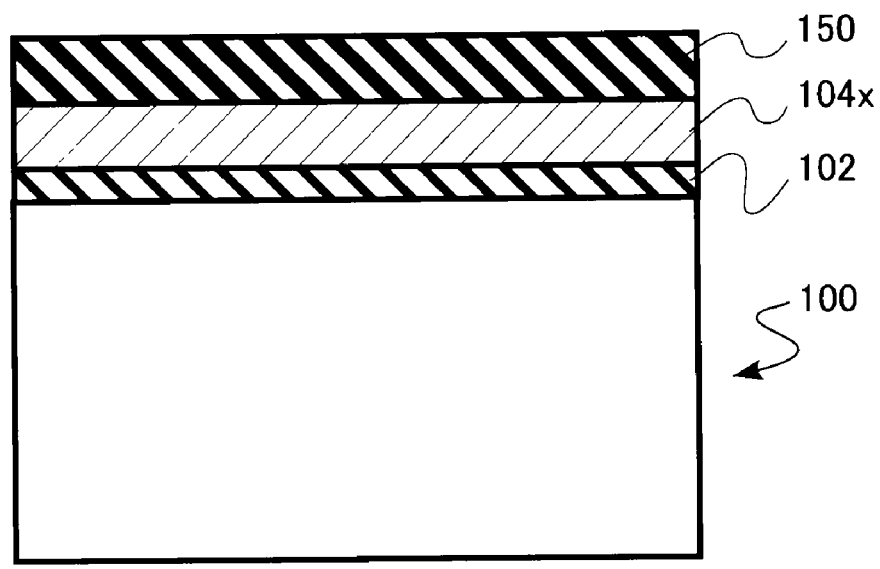
Figure 11B:
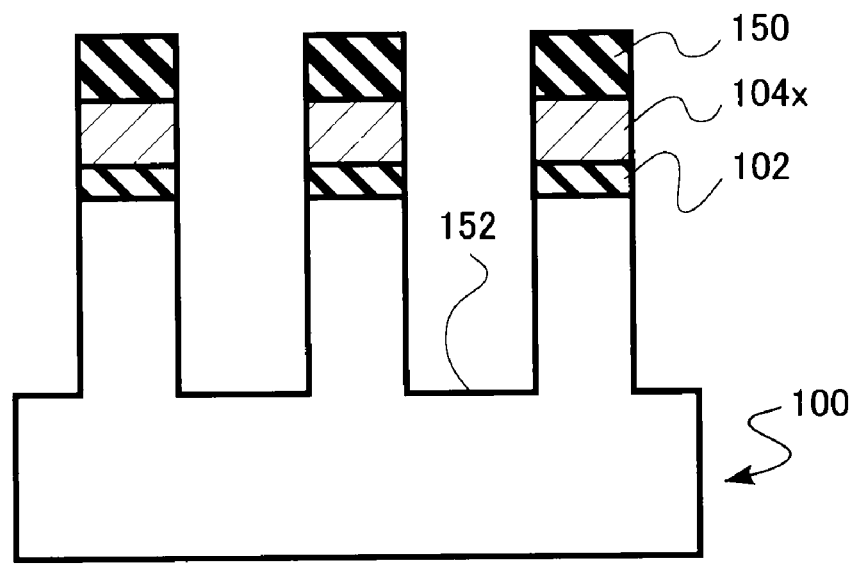

A method of fabricating the NAND flash memory device 10 will next be explained with reference to FIGS. 10A, 10B, 11A, 11B, . . . , 19A and 19B below. FIGS. 10A, 11A, . . . , 19A are diagrams showing cross-sectional structures at some major process steps in the manufacture of the memory cell array of NAND flash memory 10 shown in FIG. 1, wherein the structures shown are each taken along line C-C of FIG. 1. FIGS. 10B, 11B, . . . , 19B are sectional views, taken along line B-B of FIG. 1, of their corresponding preceding views of FIGS. 10A, 11A, . . . , 11A, respectively.

Firstly, a semiconductor substrate 100 is prepared. This substrate may be a silicon substrate of the p-type conductivity. Then, as shown in FIGS. 10A and 10B, a tunnel insulator film 102 is formed by known thermal oxidation techniques on a top surface of the p-type Si substrate 100 to a predetermined thickness—for example, 8 nanometers (nm) or more or less. This film 102 is made of silicon oxide ($SiO_2$). Then, on this $SiO_2$ tunnel insulator film 102, a p-type impurity-doped polycrystalline silicon film—say, "first" poly-Si layer—104x is deposited to a thickness of approximately 50 nm by low-pressure chemical vapor deposition (LPCVD) techniques. This p-type poly-Si film 104x is for later use as the charge storage layers of memory cell transistors MT. Next, film 104x is covered on its top surface with a film 150 of chosen mask material, such as $Si_3N_4$ for example. This mask film 150 is deposited by LPCVD to a thickness of about 50 nm.

Next, a photoresist film is formed atop the mask film 150 by spin coat techniques. This resist film is patterned by photolithography techniques to form a mask which is for etching of the resist film. Then, this etching mask is used to selectively remove the mask film 150 by reactive ion etch (RIE) techniques, thereby providing a patterned mask film. After the selective etching, the resist film is removed away. With the patterned mask film 150 as a mask, the first poly-Si layer 104$x$ and tunnel insulator film 102 plus Si substrate 100 are selectively etched in the column direction.

As shown in FIGS. 11A and 11B, the selective etching results in that narrow and deep grooves—say, trenches—152 are defined, which vertically extend through the first poly-Si layer 104$x$ and tunnel insulator film 102 as better shown in FIG. 11B. Then, an insulative film made for example of $SiO_2$ for use as the sideface dielectric film 110 is formed by thermal oxidation on exposed surface portions of the Si substrate 100 to a thickness of about 10 nm in such a manner that this film 110 covers inner sidewalls and bottom faces of the trench-like grooves 152 thus defined.

Figure 12A:
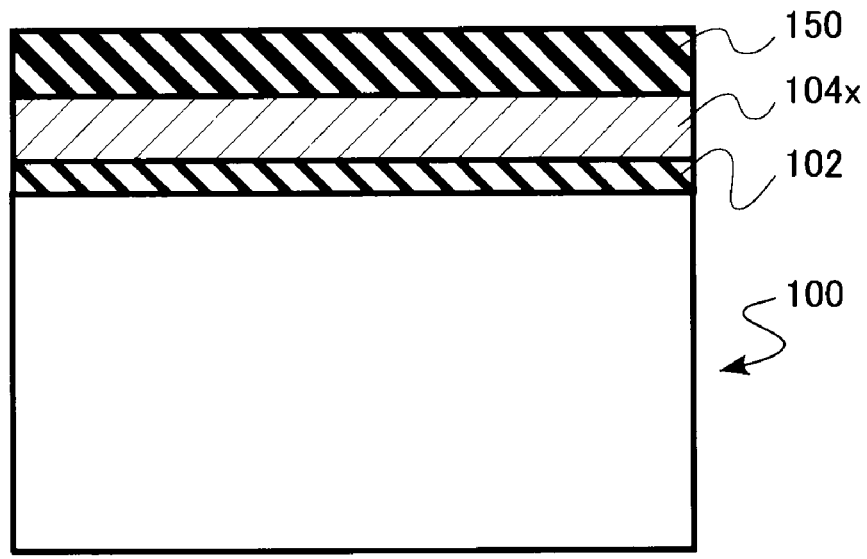
Figure 12B:
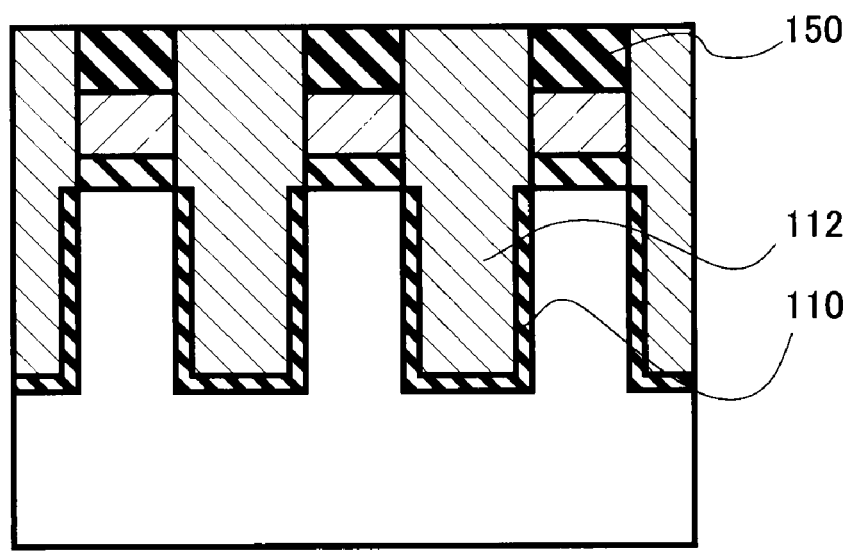

Next, as shown in FIGS. 12A-12B, the individual trench groove 152 is filled with a p-type impurity-doped poly-Si layer for use as the sideface electrodes 112, which layer is buried therein by LPCVD to have a thickness of about 100 nm. Then, the resulting device structure is subjected to chemical mechanical polish (CMP) processing so that surface planarization is performed up to the surface of mask film 150. Next, the p-type poly-Si layer for use as the sideface electrodes 112 is subjected to RIE etch-back to a level which is beneath the surface of Si substrate 100.

Figure 13A:
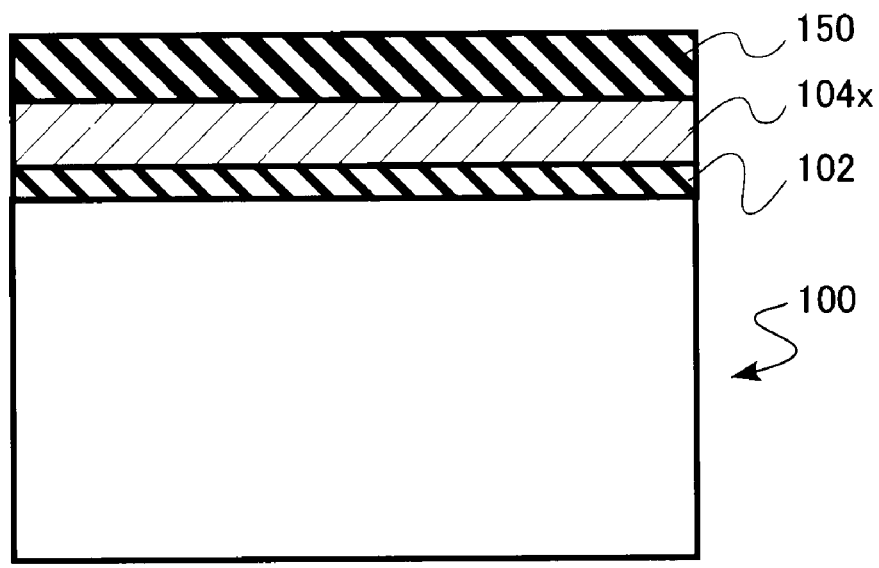
Figure 13B:
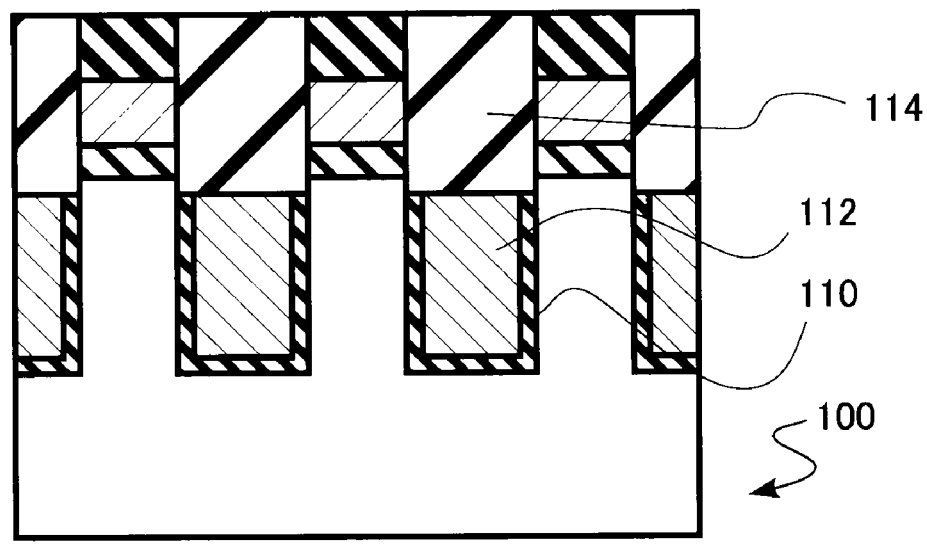
Figure 14A:
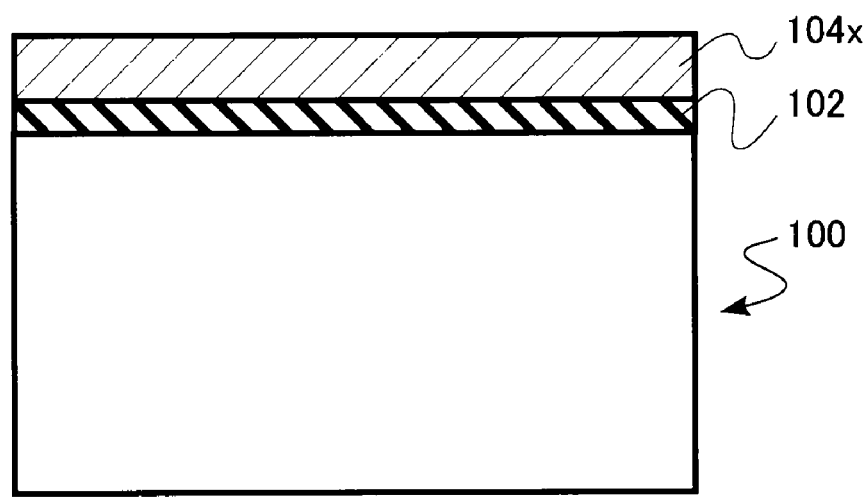
Figure 14B:
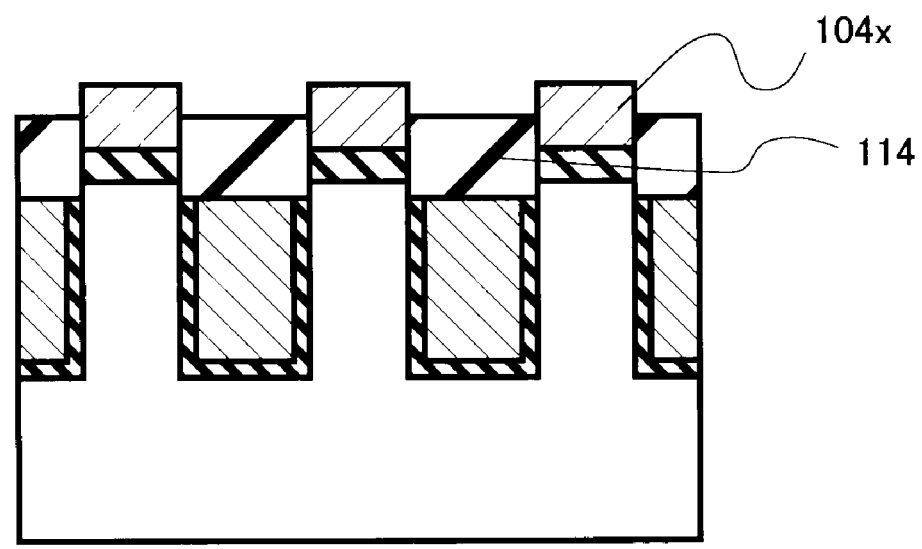

Thereafter, as shown in FIGS. 13A-13B, especially in FIG. 13B, an $SiO_2$ film for use as the element isolation film 114 is buried in the trenches 152 so that the half-etched sideface electrode 112 in each trench is covered at its surface with the element isolator film 114. Then, CMP is applied thereto for planarization to the surface of mask film 150. Then, as shown in FIGS. 14A-14B, the mask film 150 is etched away. Thereafter, the element isolator film 114 is subjected to etchback by RIE to an extent that side surfaces of first poly-Si layer 104$x$ are at least partially exposed.

Figure 15A:
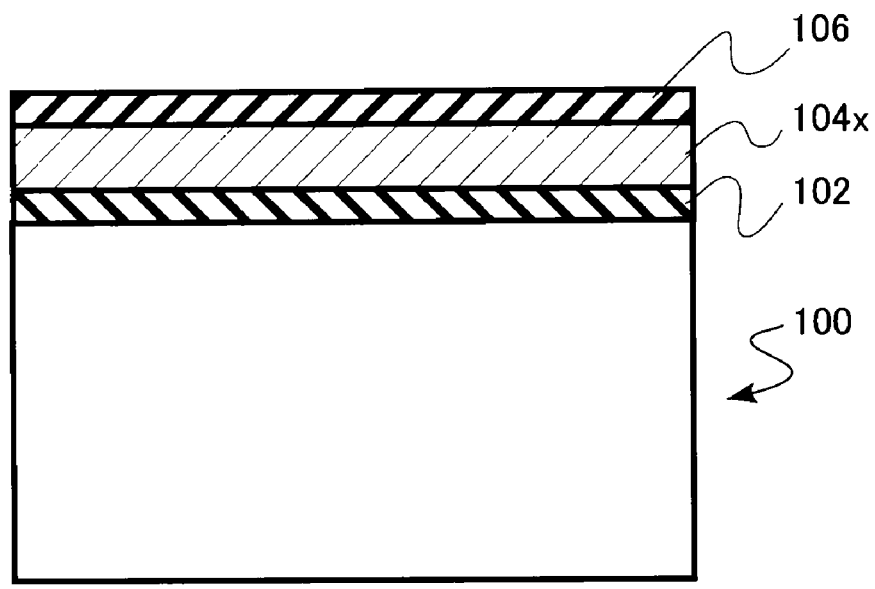
Figure 15B:
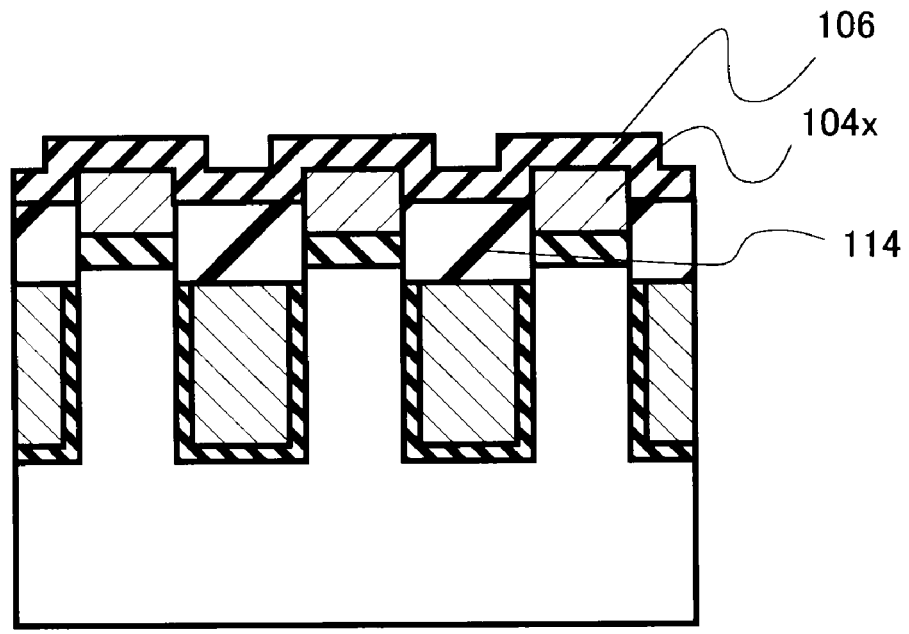

Next, as shown in FIGS. 15A-15B, a dielectric film 106 made of oxide-nitride-oxide (ONO) is formed by CVD on top surfaces of the first poly-Si layer 104$x$ and element isolator film 114. This ONO film has a thickness of about 10 nm, for example, and is for use as the control dielectric film stated above. Subsequently, this control dielectric film 106 is coated with a resist film 154, which is photolithographically patterned.

Figure 16A:
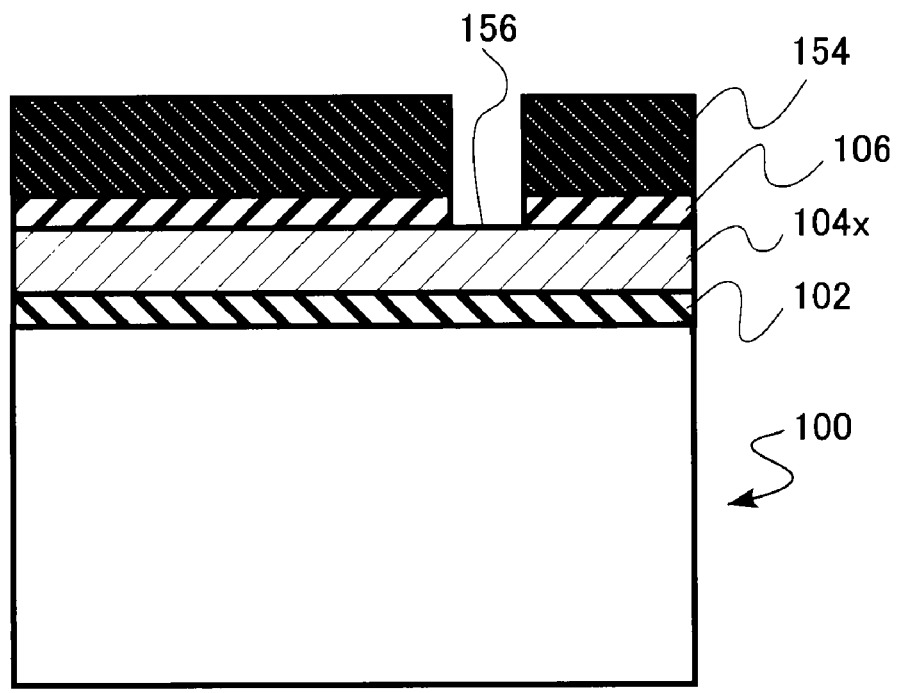
Figure 16B:
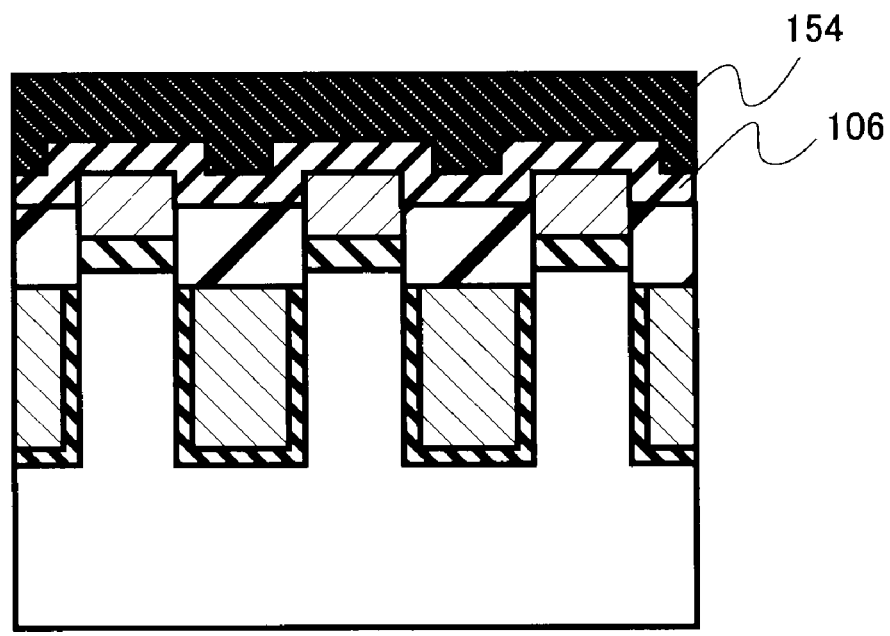
Figure 17A:
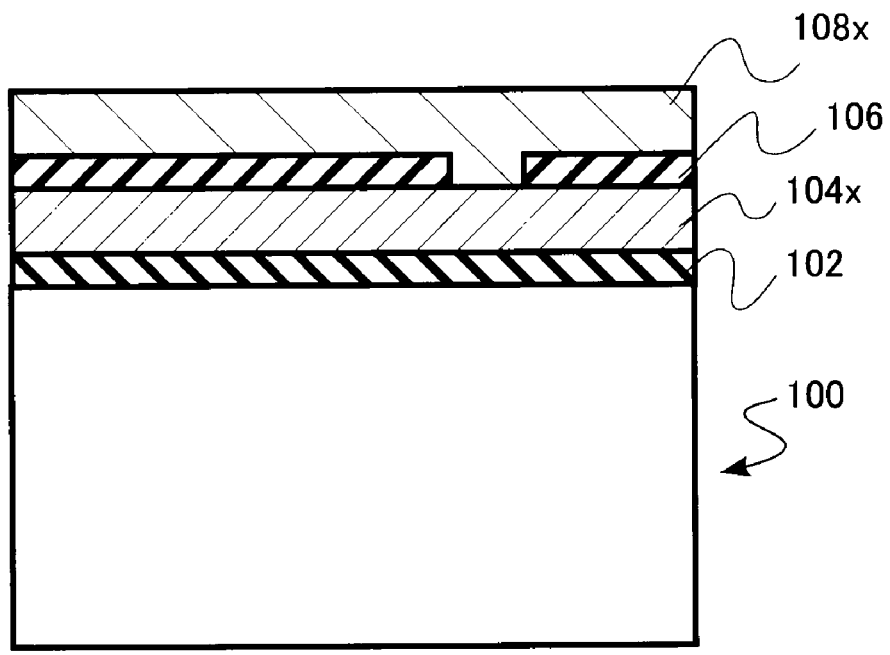
Figure 17B:
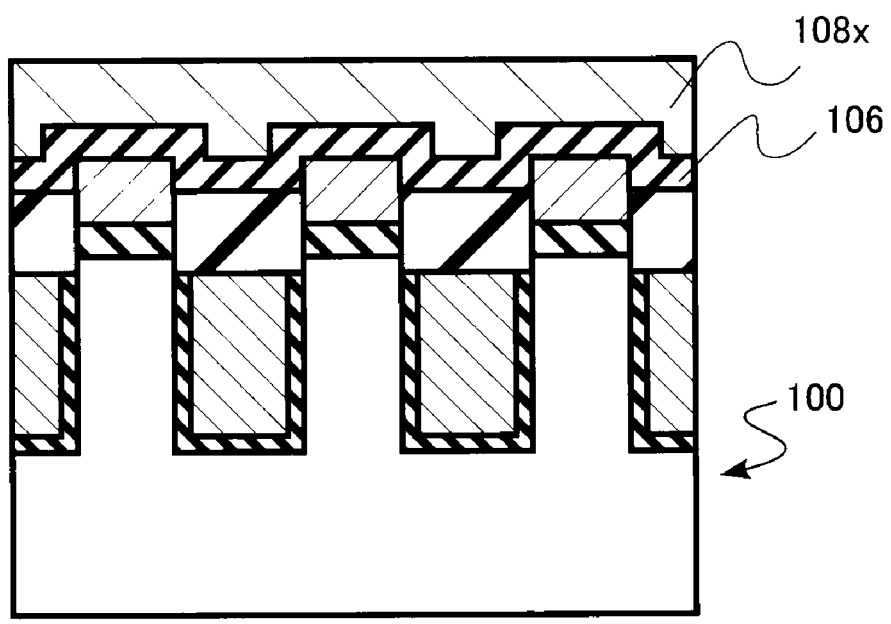

Then, as shown in FIGS. 16A-16B, with the patterned resist film 154 being used as a mask, through-going holes including a through-hole 156 are defined by RIE at specified portions of the control dielectric film 106. After the resist film 154 is removed, a "second" poly-Si layer 108$x$ for use as the p-type impurity-doped control electrode is deposited on the control dielectric film 106 to a thickness of about 50 nm, as shown in FIGS. 17A-17B.

Figure 18A:
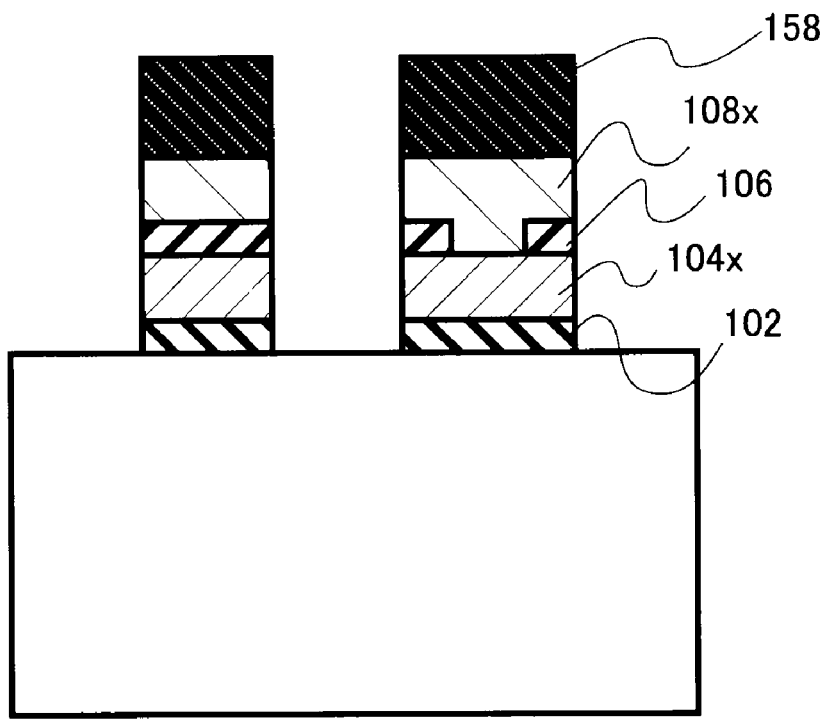
Figure 18B:
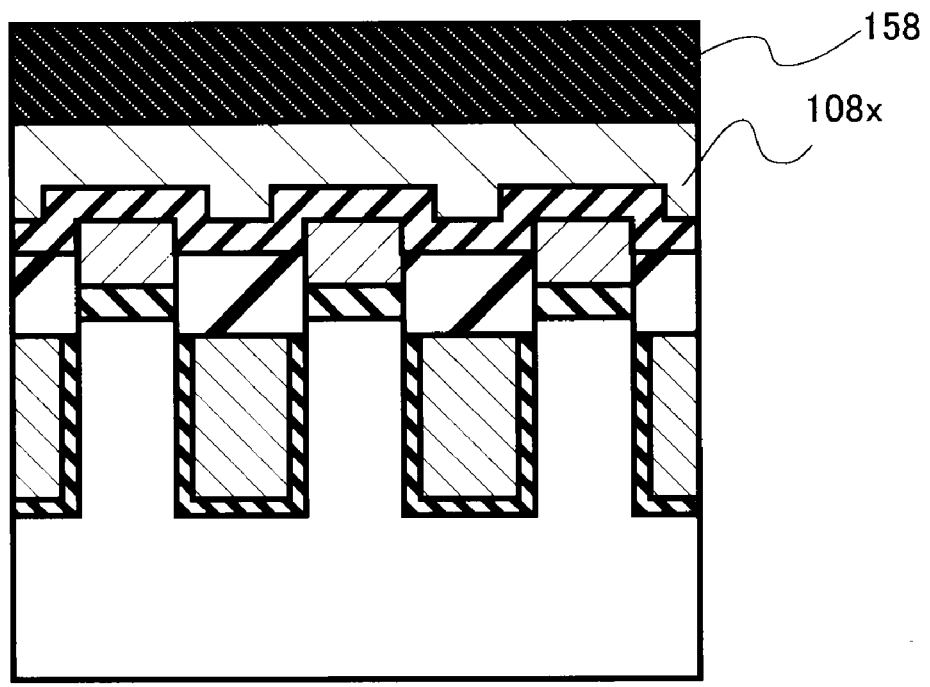

Next, a resist film 158 is coated on the second poly-Si layer 108$x$ and is then patterned by photolithography techniques. Then, as shown in FIGS. 18A-18B, with the patterned resist film 158 as a mask, a multilayer structure of the tunnel insulator film 102, first poly-Si layer 104$x$, control dielectric film 106 and second poly-Si layer 108$x$ is selectively patterned by RIE in the row direction of matrix cell array. Thereafter, the resist film 158 is etched away.

Next, with the second poly-Si layer 108$x$ as a mask, a chosen n-type impurity, such as phosphorus (P) or arsenide (As), is doped by ion implantation techniques. Thereafter, thermal processing or "baking" is performed to thereby activate the n-type impurity ions doped in the first and second poly-Si layers 104$x$ and 108$x$, resulting in formation of a charge storage layer 104 and control electrode 108 for each memory cell transistor.

Figure 19A:
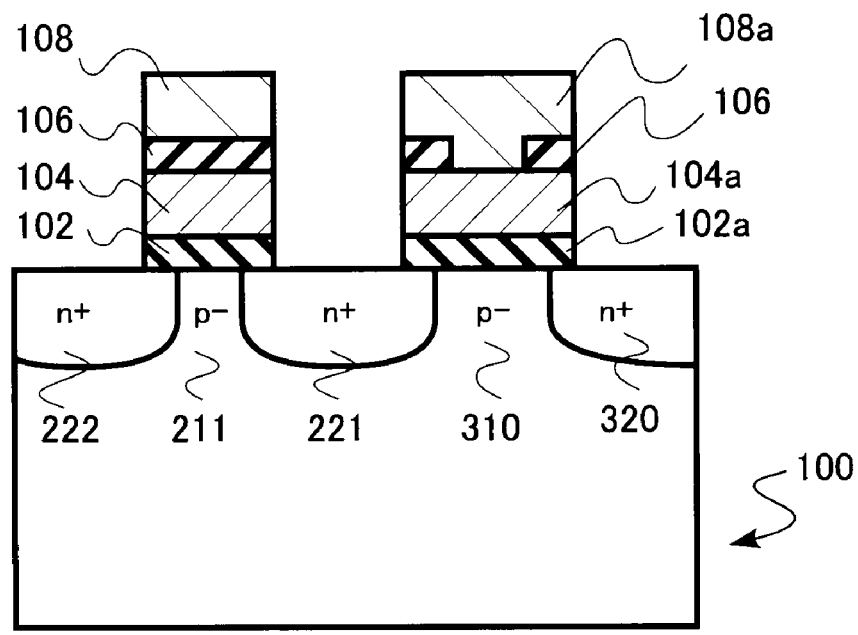
Figure 19B:
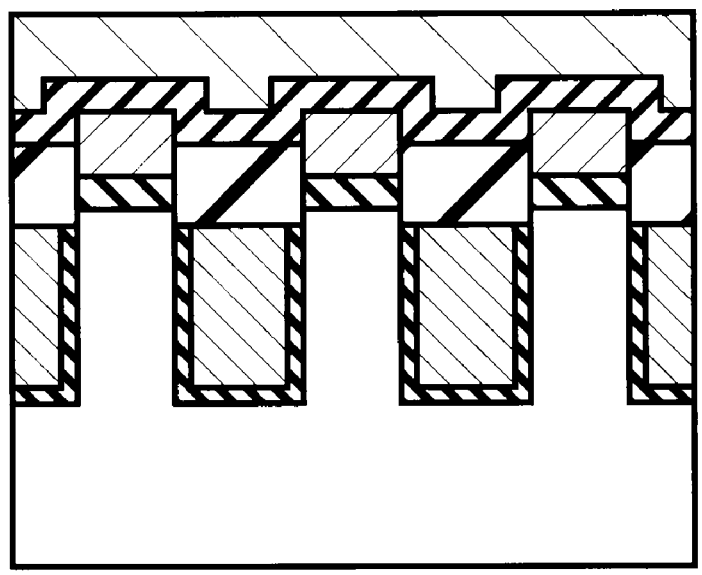

The thermal processing also activates impurity ions doped in the Si substrate 100 so that an $n^+$-type diffusion layers 221 and 222 and $p^-$-type channel region 211 are formed as shown in FIGS. 19A-19B. In this way, a memory cell transistor MT$ij$ ($i=1, 2, \ldots, m; j=1, 2, \ldots, n$) is formed. The other memory cell transistors of NAND flash memory 10, which are not depicted in FIGS. 10A-19B, are fabricated in a similar way so that a matrix of rows and columns of such cell transistors MT is obtained.

Simultaneously, as shown in FIGS. 19A-19B, select gate electrodes 104$a$ and 108$a$ and channel region 310 plus $n^+$-type diffusion layer 320 are formed, resulting in formation of a select gate transistor STD1. Lastly, several electrical interconnect wires and dielectric films required are formed by known deposition and patterning processes. Thus, main part of the NAND flash memory 10 embodying the invention is fabricated.

Figure 20:
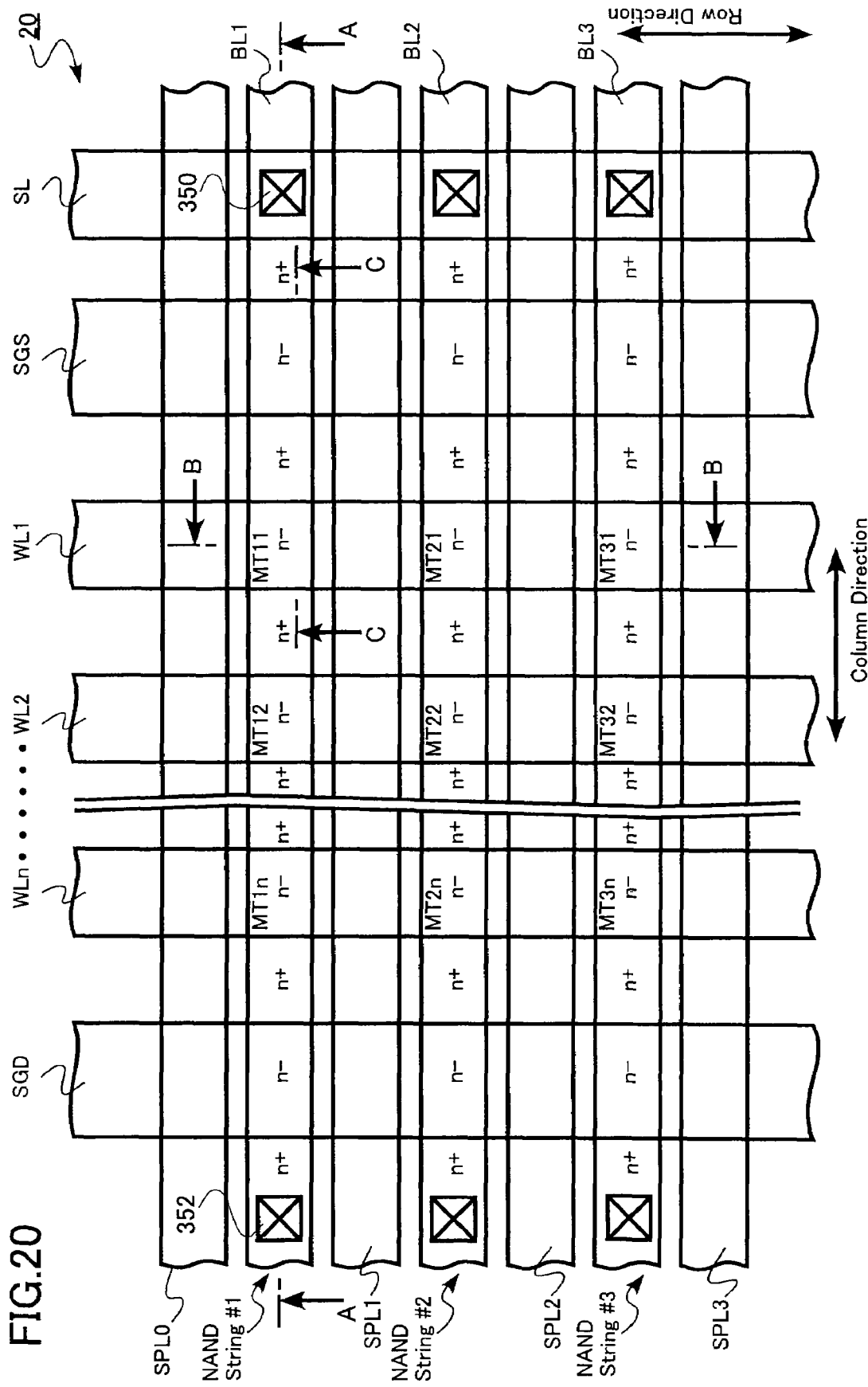
FIG. 20 is a top plan view of main part of a flash memory of the NAND type in accordance with another embodiment of the invention.
Figure 21:
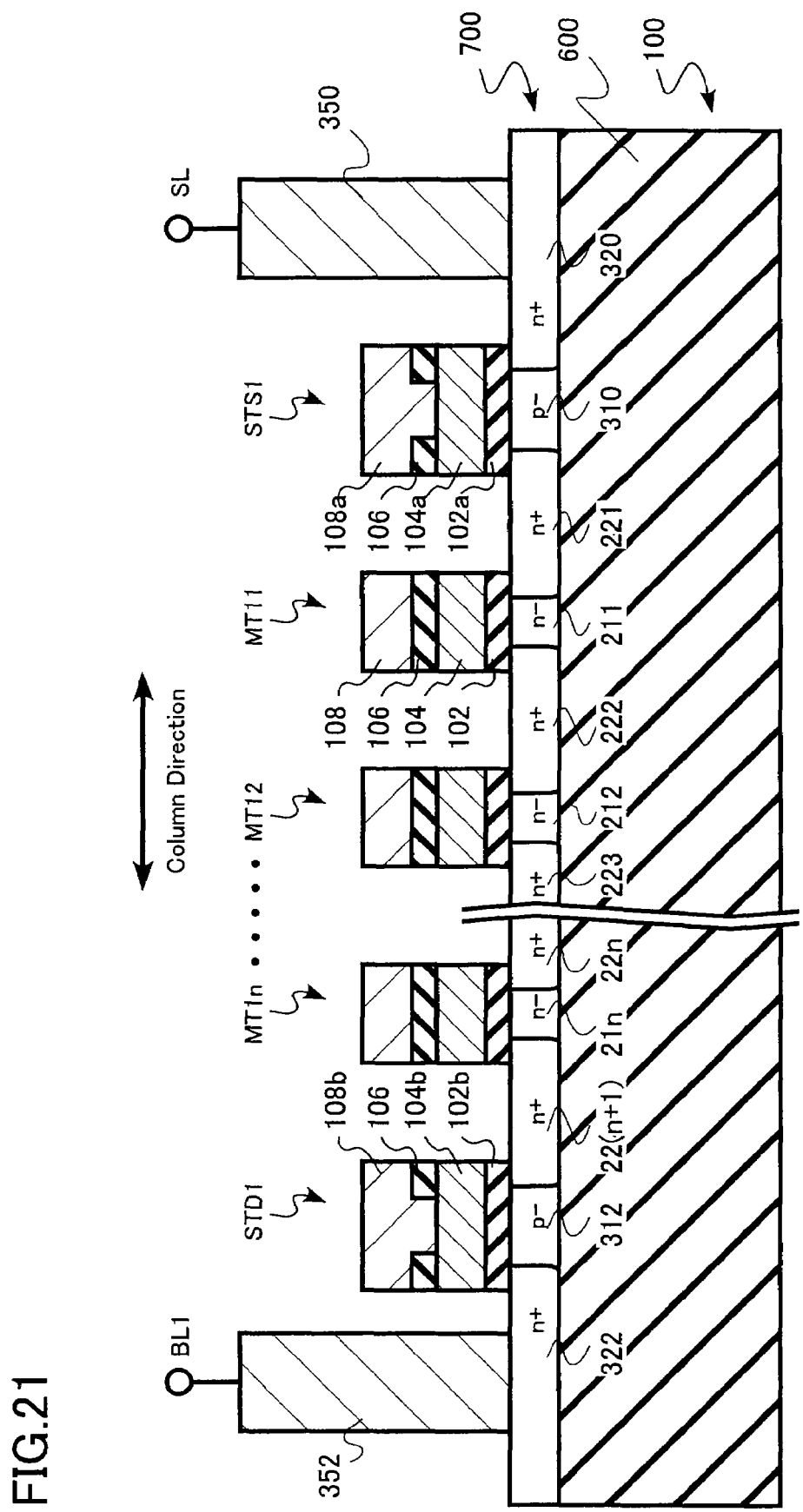
FIG. 21 is a sectional view of the NAND flash memory of FIG. 20 as taken along line A-A.
Figure 22:
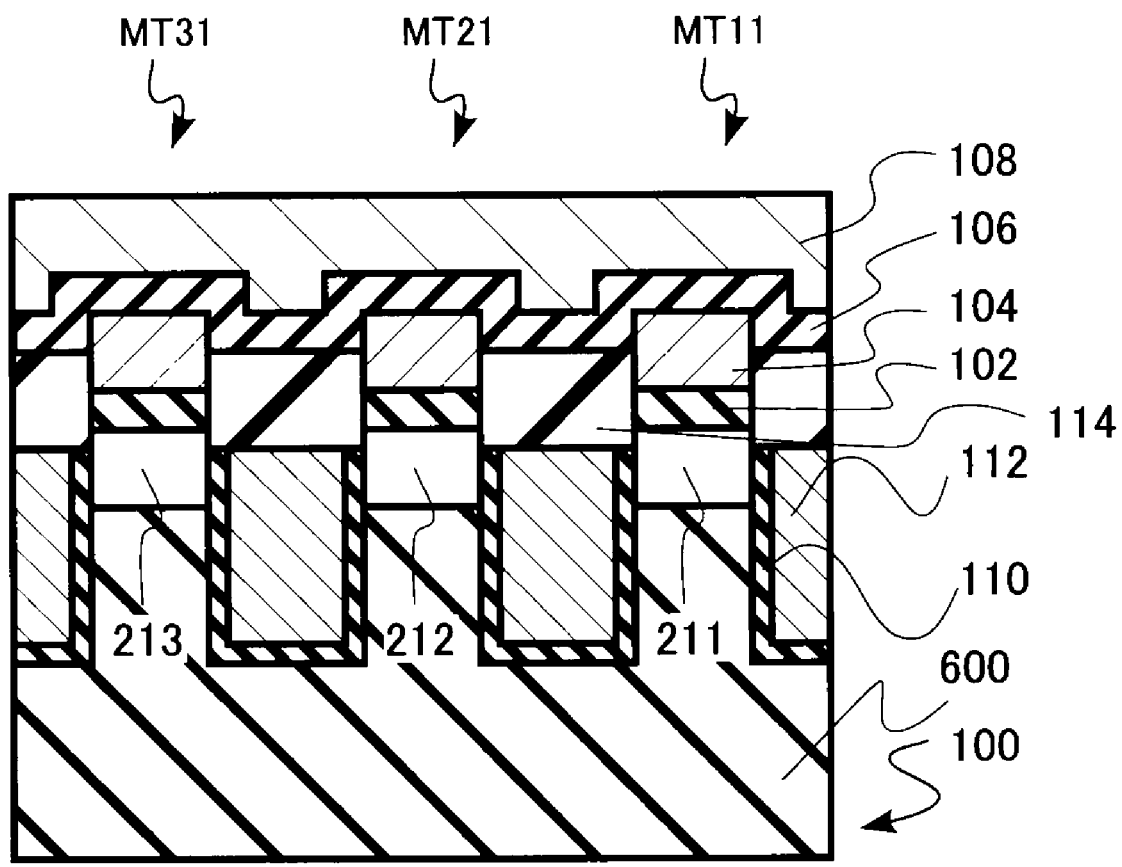
FIG. 22 is a sectional view of the NAND flash memory of FIG. 1 as taken along line B-B.

A flash memory device 20 of the NAND type in accordance with another embodiment of this invention is shown in FIGS. 20 to 22. This NAND flash memory 20 is similar to the NAND flash memory 10 shown in FIGS. 1-3 with its semiconductor substrate being modified to have a silicon-on-insulator (SOI) structure.

FIG. 20 illustrates a top plan view of main part of a memory cell array of the NAND flash memory 20 also embodying the invention. A sectional view of the NAND flash memory cell array as taken along line A-A is depicted in FIG. 21 whereas its sectional view taken along line B-B is shown in FIG. 22.

As shown in FIG. 21, the NAND flash memory 20 has its silicon substrate 100, which is structured from a lamination of a buried insulative layer 600 and a silicon layer 700 formed on a top surface of layer 600, which will be referred to as "SOI layer" hereinafter. The buried insulative layer 600 is made of silicon oxide ($SiO_2$) as an example. The memory cell array of FIG. 20 includes memory cell transistors MT11 to MT1$n$, which are formed in the SOI layer on buried $SiO_2$ layer 600.

As shown in FIG. 21, the memory cell transistors MT11 to MT1$n$ are arranged to have $n^+$-type source/drain regions 221 to 22($n$+1) formed in the SOI layer 700 and $n^-$-type channel regions 211 to 21$n$, each of which is laterally interposed between adjacent ones of the source/drain regions 221-22($n$+1). Thus, each memory cell transistor MT1$j$ ($j=1, 2, \ldots, n$) is of the depression type with its source/drain regions and channel regions being formed to have n-type conductivity.

In the NAND flash memory 20, its substrate has the SOI structure including the buried dielectric layer 600 and SOI layer 700, on which substrate the depression type memory cell transistors MT are formed. These transistors' source/drain and channel regions are formed in SOI layer 700 which is less in thickness than the gate length of each cell transistor, thereby providing memory cells of the complete depression type. Use of this transistor design makes it possible to improve the NAND flash memory 20 in cutoff characteristics of a selected memory cell transistor during read operations while at the same time increasing the read operation margin.

Figure 23:
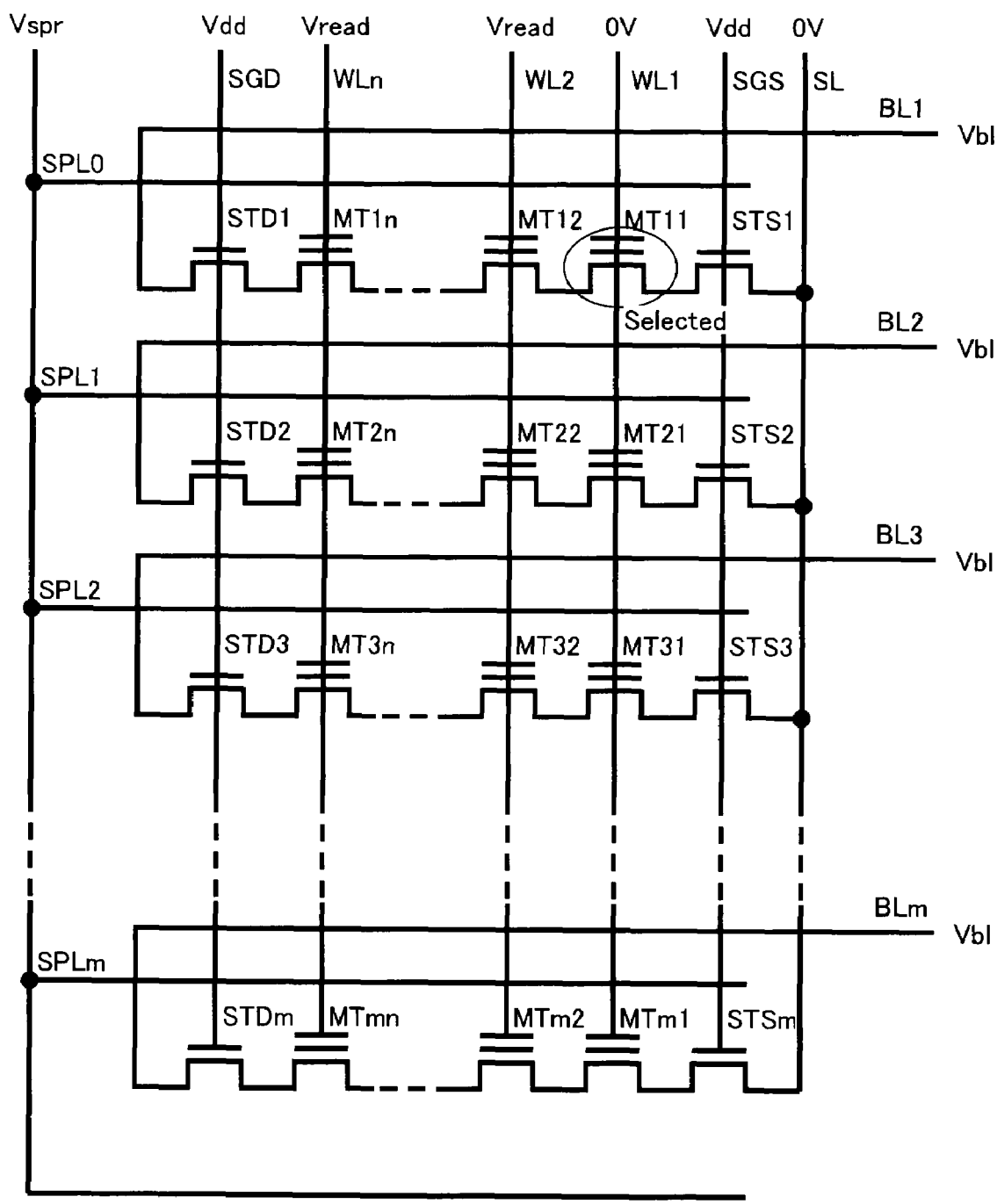
FIG. 23 is a circuit diagram of the NAND flash memory of FIG. 20 for explanation of a read operation of it.

An explanation will next be given of read, write and erase operations of the NAND flash memory device 20 also embodying the invention. First, the read operation will be explained with reference to FIG. 23 and Table 2 given below. Table 2 indicates some major operating voltages of NAND flash memory 20. FIG. 23 is a circuit diagram of main part of the memory cell array of NAND flash memory 20.

TABLE 2

| Line | Read | Write | Erase |
|---|---|---|---|
| SL | 0 V | Vdd | Vera |
| SGS | Vdd | 0 V | Vsgs |
| WL1(select) | 0 V | Vpgm | 0 V |
| WL2-WLm(unselect) | Vread | Vpass | 0 V |
| SGD | Vdd | Vdd | Vsgd |
| BL1(select) | Vbl | 0 V | Vera |
| BL2-BLn(unselect) | Vbl | Vdd | Vera |
| Sub | N.A. | N.A. | N.A. |
| SPL0-SPLm | Vspr | Vspw | Vera |

The read operation of NAND flash memory 20 is similar to that of the NAND flash memory 10 except that the application of the back-gate bias voltage Vbb is not needed in view of the presence of the buried dielectric layer 600. In NAND flash memory 20, it is possible by negative voltage application to sideface electrodes to further expand the read operation margin, which is improved by use of the depression type transistors on SOI layer 700.

Figure 24:
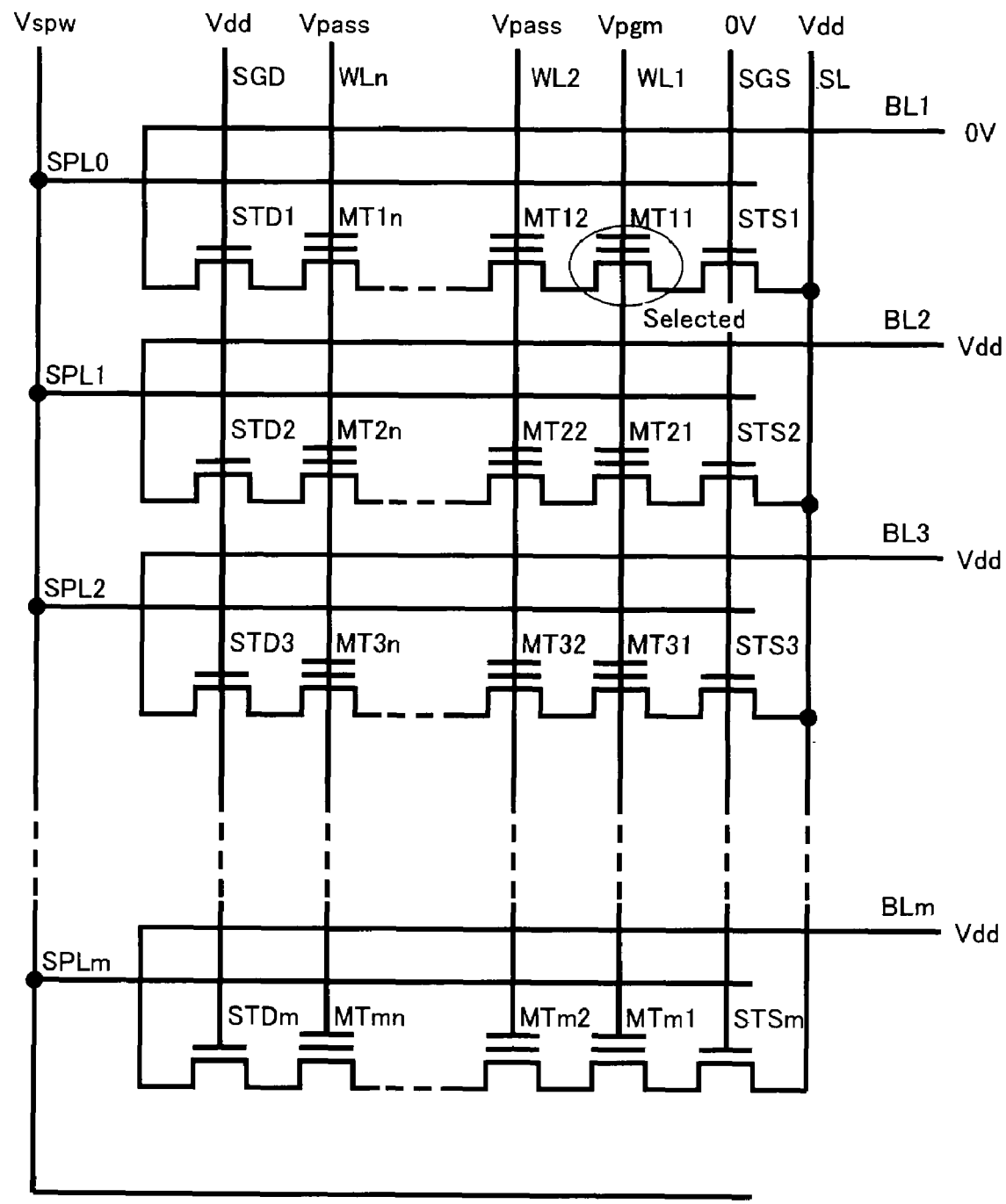
FIG. 24 is a circuit diagram of the NAND flash memory of FIG. 20 for explanation of a write operation thereof.

One example of a write operation of the NAND flash memory 20 will be explained with reference to FIG. 24 along with Table 2. FIG. 24 is a circuit diagram during the write operation of NAND flash memory 20. The write operation of NAND flash memory 20 is similar to that of the NAND flash memory 10 except that the application of the back-gate bias voltage Vbb is eliminated in view of the presence of the buried dielectric layer 600.

Recall here that the NAND flash memory 20 is designed so that the transistor channel regions and source/drain diffusion layers are formed in the SOI layer 700 having a reduced thickness. This results in NAND flash memory 20 becoming higher than the NAND flash memory 10 in initial channel and diffusion resistance values per se. Accordingly, when compared to NAND flash memory 10, NAND flash memory 20 is higher in risk of unwanted increases in channel/diffusion resistances due to random fluctuations of impurity atoms doped. This risk leads to an increase in resistance of NAND strings during write operations, resulting in a likewise increase in write operation errors. To avoid this, it is effective to use the technique for applying a positive voltage (e.g., +0.5V) to sideface electrodes 112 to thereby suppress or prevent the resistance increase of NAND strings.

Figure 25:
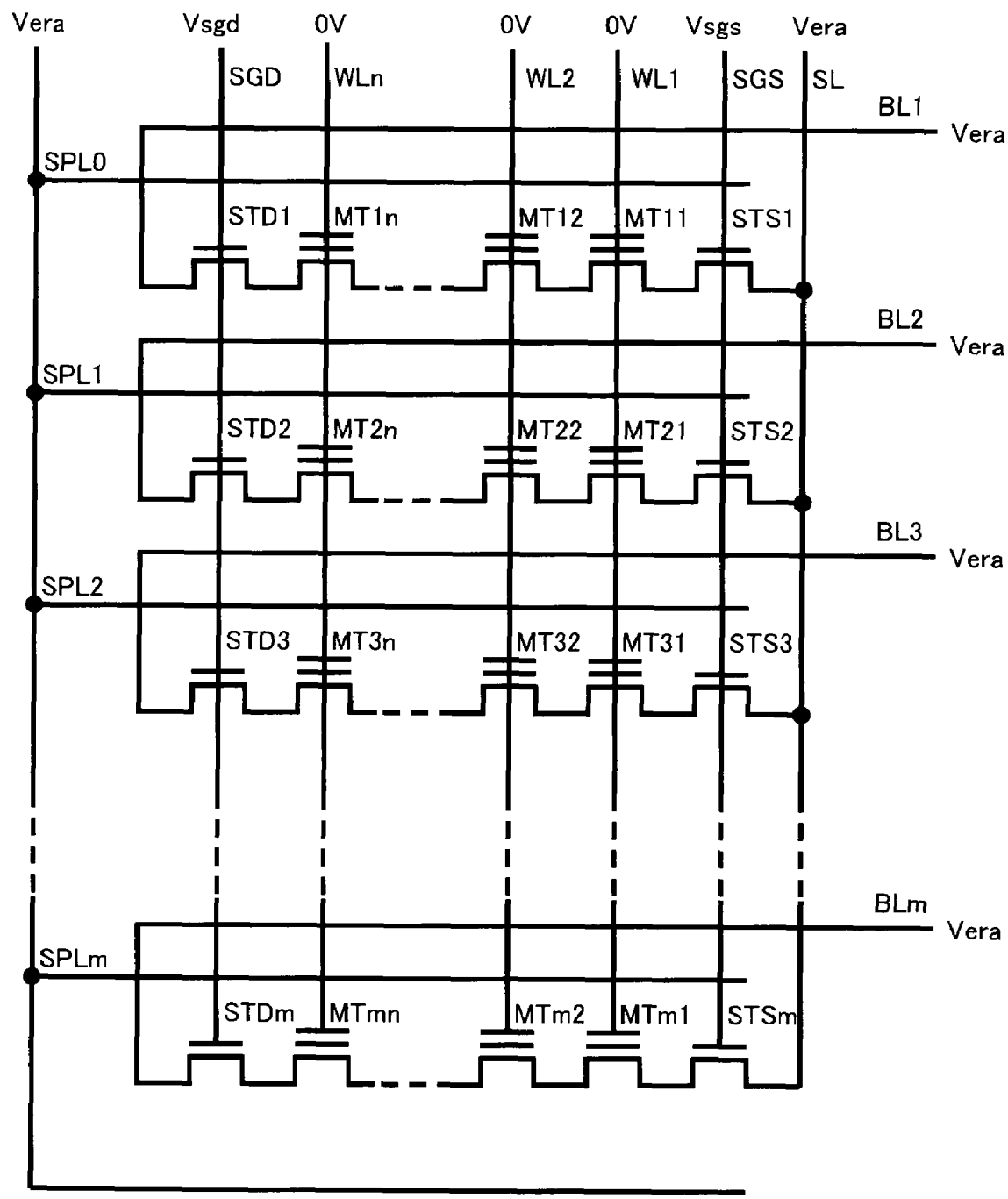
FIG. 25 is a circuit diagram of the NAND flash memory of FIG. 20 for explanation of an erase operation thereof.

Next, an exemplary erase operation of NAND flash memory 20 will be discussed with reference to FIG. 25 and Table 2. FIG. 25 is a circuit diagram during the erase operation of NAND flash memory 20.

All the bitlines BL1-BLm and common source line SL are applied an erase voltage Vera (e.g., +20V). A predefined potential level, e.g., +4V, of voltage—say, initial voltage Vsgd—is applied to the select gate line SGD, causing select gate transistors STD1-STDm to turn on. This permits the potential of the erase voltage Vera (e.g., +20V) to be transferred to memory cell transistors MT1n, MT2n, . . . , MTmn. In this session, the other select gate line SGS is applied an initial voltage Vsgs (e.g., +4V) so that select gate transistors STS1-STSm turn on, causing the erase voltage Vera (e.g., +20V) of source line SL to be sent to memory cell transistors MT11, MT21, . . . , MTm1.

Then, all the wordlines WL1-WLn are set to 0V. When their control electrodes 108 are set at 0V, all the memory cell transistors MT11-MT1n, MT21-MT2n, . . . , MTm1-MTmn are driven to turn on, since these are of the depression type. Upon application of the erase voltage (e.g., +20V) to SOI layer 700, electrons are ejected from the charge storage layer 104 of the individual memory cell transistor for injection into its associated channel region via tunnel insulator film 102 interposed therebetween.

When electrons are released from charge storage layer 104, the threshold voltage of selected memory cell transistor MT11 changes from the positive threshold voltage Vp to the negative threshold voltage Ve, resulting in establishment of an erase state (i.e., logic "1" data is stored therein). As a result, the memory cell transistors MT1n, MT2n, . . . , MTmn are all erased at a time.

As NAND flash memory 20 is arranged so that the transistor channel regions and source/drain diffusion layers are formed in the SOI layer 700 that is less in thickness, this memory device can experience erase deficiency or erase failure occurring due to a potential drop of the erase voltage Vera being given from the substrate side.

To avoid such erase deficiency or failure, it is effective to use the technique for applying the erase voltage Vera (e.g., +20V) to the sideface electrodes 112 for electron release into these electrodes while at the same time making channel regions stable in surface potential without any appreciable voltage drop to thereby facilitate or accelerate the transfer of electrons to the channels.

Figure 26:
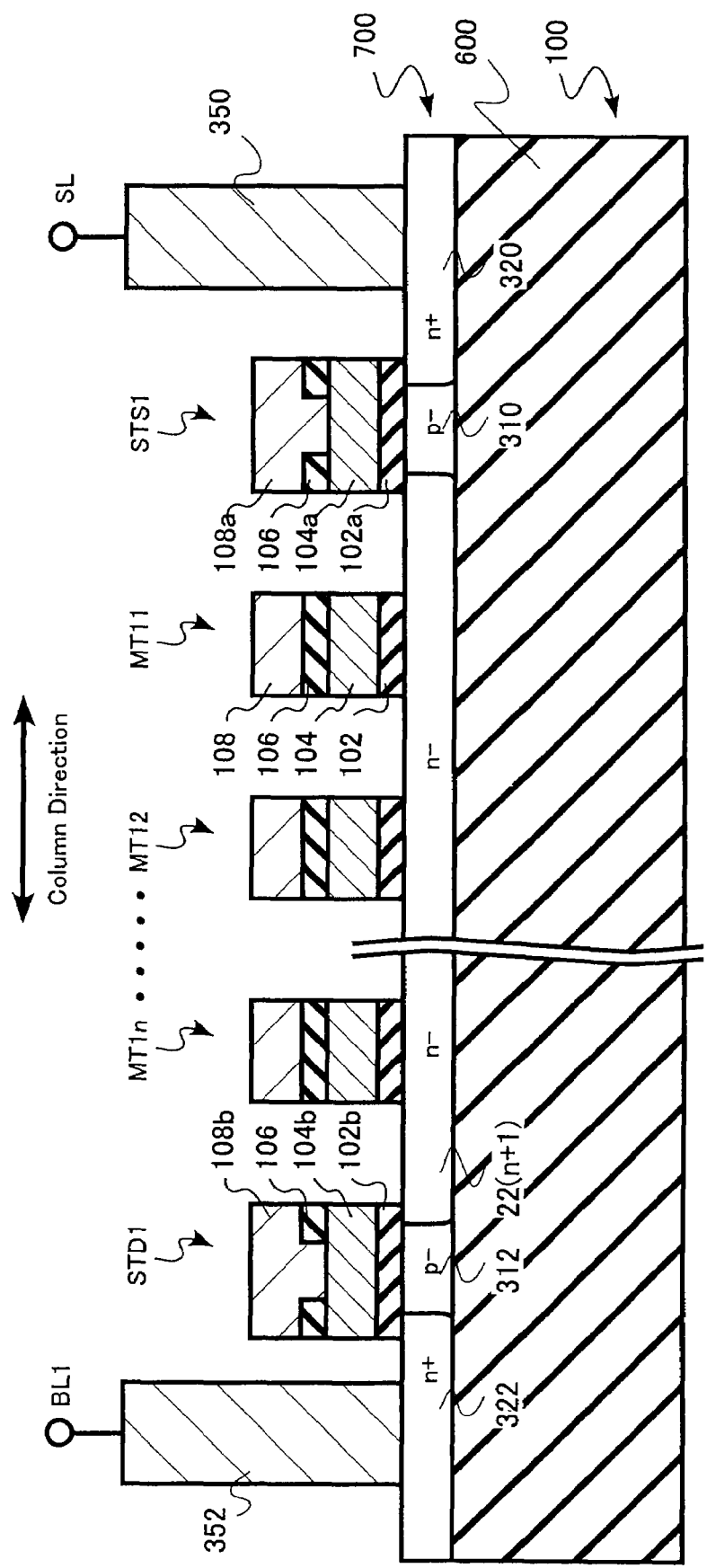
FIG. 26 is a sectional view of the NAND flash memory in accordance with another embodiment of the invention.

FIG. 26 illustrates a sectional view of a memory cell of the NAND flash memory also embodying the invention. This NAND flash memory has different memory cell transistor source/drain structure compared to the NAND flash memory 20 shown in FIGS. 20-22. As shown in FIG. 26, memory cell transistors MT11 to MT1n are arranged to have $n^-$-type source/drain and $n^-$-type channel regions.

In an operation of this NAND flash memory, voltage Vread applied to wordlines of non-selected memory cells inverts $n^-$-type source/drain to form $n^+$ regions. Elimination of $n^+$-type source/drain from the memory cell transistors enables a simple fabrication process of this NAND flash memory.

Although currently preferred embodiments of this invention have been described with reference to practical examples thereof, the embodiments are mere examples and are not intended to limit the invention. Additionally, while in the description of the illustrative embodiments, explanations of those parts that are not directly required for explanation of this invention are omitted in regard to the nonvolatile semiconductor memory devices and fabrication methodology thereof, any appropriate elements concerning the required nonvolatile semiconductor memory devices and fabrication processes thereof may be used on a case-by-case basis.

For instance, the semiconductor substrate and transistor channel regions which are made of silicon (Si) in the above-stated embodiments may be modified so that each is made of other similar suitable semiconductor materials, including but not limited to $Si_xGe_{1-x}$ (where "x" is greater than or equal to 0 and less than 1), SiC, GaN, GaAs and InP. In this case also, similar results are obtainable.

Also note that every nonvolatile semiconductor memory device that comprises the subject matter of this invention and is design-modifiable by a person skilled in the art to which the invention pertains should be interpreted to fall within the scope of this invention. The scope of the invention is defined by the coverage of appended claims and equivalents thereto.

What is claimed is:

1. A nonvolatile semiconductor memory device comprising:
   a semiconductor substrate; and
   a plurality of memory cells on the semiconductor substrate, each of the memory cells has a memory cell transistor; wherein
   the memory cells form an array including serial connections of a plurality of the memory cell transistors, each of the memory cell transistors has a pair of source and drain regions formed in the semiconductor substrate, a channel region having upper surface and side surfaces laterally interposed between the source and drain regions, a tunnel insulator film on the upper surface of the channel region, a charge storage layer on the tunnel insulator film, a control dielectric film on the charge storage layer, a control electrode on the control dielectric film, a sideface dielectric film on the side surfaces of the channel region, and first and second sideface electrodes provided on the sideface dielectric film to oppose each other with the channel region being laid therebetween, wherein the first sideface electrode is shared between neighboring ones of the memory cell transistors which are serially connected together, and the second sideface electrode is shared between neighboring ones of the memory cell transistors which are serially connected together.

2. The device according to claim 1, wherein the semiconductor substrate has a buried dielectric layer below the channel region.

3. The device according to claim 1, wherein the memory cell transistors are depression type transistors.

4. The device according to claim 1, wherein the tunnel insulator film is less in silicon dioxide film equivalent thickness than the sideface dielectric film.

5. The device according to claim 1, further comprising:
a driver for applying a negative voltage to the sideface electrodes during a read operation of the memory cell transistors.

6. The device according to claim 1, further comprising:
a driver for applying a positive voltage to the sideface electrodes during a write operation of the memory cell transistors.

7. The device according to claim 1, further comprising:
a driver for applying a positive voltage to the sideface electrodes during an erase operation of the memory cell transistors.

8. The device according to claim 1, wherein the charge storage layer is made of polycrystalline silicon.

9. The device according to claim 1, wherein the semiconductor substrate is made of silicon.

10. The device according to claim 1, wherein each of the memory cell transistors is capable of storing therein more than two values of data.

* * * * *